US009316788B2

(12) United States Patent
Witzens

(10) Patent No.: US 9,316,788 B2
(45) Date of Patent: Apr. 19, 2016

(54) LASER TO CHIP COUPLER

(75) Inventor: Jeremy Witzens, Aachen (DE)

(73) Assignee: RWTH AACHEN (DE)

( * ) Notice: Subject to any disclaimer, the term of this patent is extended or adjusted under 35 U.S.C. 154(b) by 58 days.

(21) Appl. No.: 13/879,379

(22) PCT Filed: Oct. 13, 2011

(86) PCT No.: PCT/EP2011/067938
§ 371 (c)(1),
(2), (4) Date: Apr. 30, 2013

(87) PCT Pub. No.: WO2012/049273
PCT Pub. Date: Apr. 19, 2012

(65) Prior Publication Data
US 2013/0209112 A1 Aug. 15, 2013

Related U.S. Application Data

(60) Provisional application No. 61/393,170, filed on Oct. 14, 2010, provisional application No. 61/437,672, filed on Jan. 30, 2011, provisional application No. 61/442,178, filed on Feb. 12, 2011.

(51) Int. Cl.
G02B 6/125 (2006.01)
G02B 6/28 (2006.01)
G02B 6/30 (2006.01)
G02B 6/42 (2006.01)
G02B 6/13 (2006.01)
G02B 6/12 (2006.01)
(Continued)

(52) U.S. Cl.
CPC  *G02B 6/125* (2013.01); *G02B 6/13* (2013.01); *G02B 6/2813* (2013.01); *G02B 6/305* (2013.01); *G02B 6/42* (2013.01); *G02B 6/423* (2013.01); *G02B 6/12007* (2013.01); *G02B 6/34* (2013.01); *H01S 5/0228* (2013.01); *H01S 5/02252* (2013.01); *Y10T 29/49826* (2015.01)

(58) Field of Classification Search
CPC ............ G02B 6/125; G02B 6/13; G02B 6/12
See application file for complete search history.

(56) References Cited

U.S. PATENT DOCUMENTS 5,375,184 A * 12/1994 Sullivan ........................ 385/129
6,310,995 B1 * 10/2001 Saini et al. ...................... 385/28
(Continued)

OTHER PUBLICATIONS

Liao, Chun-Wei, et al., "Fiber-Core-Matched Three-Dimensional Adiabatic Tapered Couplers for Integrated Photonic Devices", Journal of Lightwave Technology, Mar. 1, 2011, vol. 29, No. 5.
(Continued)

*Primary Examiner* — Kaveh C Kianni
(74) *Attorney, Agent, or Firm* — McCarter & English, LLP

(57) ABSTRACT

A method and an apparatus for butt-coupling an input beam incoming from a photonic device of a second optical element to a primary photonic chip at an input interface of the primary photonic chip is disclosed. The primary photonic chip comprises a coupling apparatus. The light from the input beam is butt-coupled to the coupling apparatus. The coupling apparatus comprises a plurality of more than one single mode optical paths on the primary photonic chip. The single mode optical paths are strongly coupled to each other at the input interface of the primary photonic chip. Regions of strongly coupled single mode optical paths can correspond to one or both of distinct but highly coupled waveguides or waveguides fully merged into a multi-mode section.

29 Claims, 9 Drawing Sheets

(51) Int. Cl.
   *G02B 6/34* (2006.01)
   *H01S 5/022* (2006.01)

(56) References Cited

U.S. PATENT DOCUMENTS

| | | | |
|---|---|---|---|
| 6,559,464 B1 | 5/2003 | Flanders et al. | |
| 6,970,628 B2 | 11/2005 | Boudreau | |
| 7,068,887 B1 | 6/2006 | Gunn, III et al. | |
| 7,193,771 B1* | 3/2007 | Smith et al. | 359/333 |
| 7,260,289 B1 | 8/2007 | Gunn, III et al. | |
| 7,308,166 B1 | 12/2007 | Peng et al. | |
| 7,532,792 B2* | 5/2009 | Skovgaard et al. | 385/39 |
| 7,539,373 B1* | 5/2009 | Logvin et al. | 385/28 |
| 8,190,030 B2* | 5/2012 | Leclair et al. | 398/139 |
| 8,515,278 B2* | 8/2013 | Cheng et al. | 398/44 |
| 8,737,845 B2* | 5/2014 | Fiorentino et al. | 398/200 |
| 2002/0085594 A1* | 7/2002 | Pezeshki et al. | 372/20 |
| 2003/0063884 A1* | 4/2003 | Smith et al. | 385/129 |
| 2003/0210725 A1* | 11/2003 | Prassas et al. | 372/50 |
| 2004/0033309 A1* | 2/2004 | Fardad et al. | 427/162 |
| 2004/0071403 A1* | 4/2004 | Lipson et al. | 385/43 |
| 2004/0202429 A1* | 10/2004 | Margalit et al. | 385/49 |
| 2007/0153859 A1* | 7/2007 | Muendel et al. | 372/50.1 |
| 2008/0044126 A1* | 2/2008 | Costa et al. | 385/14 |
| 2009/0316159 A1* | 12/2009 | Scott | 356/454 |
| 2010/0266276 A1* | 10/2010 | Zheng et al. | 398/43 |
| 2011/0235968 A1* | 9/2011 | Na et al. | 385/28 |
| 2011/0274438 A1* | 11/2011 | Fiorentino et al. | 398/141 |
| 2011/0290002 A1* | 12/2011 | Heidrich et al. | 73/24.02 |
| 2013/0071850 A1* | 3/2013 | Duer | 435/6.12 |
| 2014/0294345 A1* | 10/2014 | Kopp et al. | 385/24 |

OTHER PUBLICATIONS

Tsai, Chih-Hung, et al., "High-Power Angled Broad-Area 1.3 um Laser Diodes With Good Beam Quality", IEE Photonics Technology Letters, Nov. 2004, vol. 16, No. 11.

Kapulainen, M., et al., "Hybrid Integration of InP Lasers with SOI Waveguides Using Thermocompression Bonding", Sep. 19, 2008, Proceedings of the 5th IEEE International Conference on Group IV Photonics.

Soldano, Lucas B., et al., "Optical Multi-Mode Interference Devices Based on Self-Imaging: Principles and Applications", Journal of Lightwave Technology, Apr. 1995, vol. 13, No. 4.

Shi, Yaocheng, et al., "Improved performance of a silicon-on-insulator-based multimode interference coupler by using taper structures", Optics Communications, Sep. 15, 2005, pp. 276-282, vol. 253, No. 4-6, North Holland Publishing Co., Amsterdam, NL.

Dai, Daoxin, et al., "Compact silicon-on-insulator-based multimode interference coupler with bilevel taper structure", Applied Optics, Aug. 20, 2005, pp. 5036-5041, vol. 44, No. 24, Optical Society of America, Washington, DC, US.

Witzens, Jeremy, et al., "Hybrid superprism with low insertion losses and suppressed cross-talk", Physical Review E. 71, 2005, The American Physical Society.

Lifante, Gines, "Modal Orthogonality and Normalization", Integrated Photonics: Fundamentals, Edition 2003, Chapter 4, Section 4.1.1., John Wiley & Sons Ltd., West Sussex, England.

International Search Report for International Application No. PCT/EP2011/067936, mailed Feb. 22, 2012.

* cited by examiner

LASER TO CHIP COUPLER

CROSS-REFERENCE TO RELATED APPLICATIONS

This application is the U.S. National Phase of International Application No. PCT/EP2011/067938, filed Oct. 13, 2011, claiming benefit of U.S. Provisional Patent Application No. 61/393,170, filed Oct. 14, 2010, U.S. Provisional Patent Application No. 61/437,672, filed Jan. 30, 2011, and U.S. Provisional Patent Application No. 61/442,178, filed Feb. 12, 2011, the contents of which are hereby incorporated by reference in their entirety as part of the present disclosure.

FIELD OF THE INVENTION

This invention relates to an apparatus enabling the attachment of a primary photonic chip to a second optical element such as a semiconductor laser chip, a planar lightwave circuit or another photonic chip, with low manufacturing costs and high optical coupling efficiency between the primary photonic chip and the second optical element.

In particular this apparatus can relax alignment tolerances required to achieve high optical coupling efficiencies to a level where such alignment accuracies can be obtained with pick-and-place assembly tools without active optical alignment. This applies to horizontal alignment accuracies, defined as being along a direction parallel to the surface of the primary photonic chip. It can also mechanically guaranty high alignment accuracies by design in the vertical direction, defined as the direction perpendicular to the surface of the primary photonic chip.

BACKGROUND OF THE INVENTION

Fabrication of optical devices with semiconductor fabrication technology and lithographic definition of photonic devices allows mass-manufacturing of optical devices and systems, enabling low cost production of compact, integrated solutions. A major difficulty remains however with coupling light on and off from optical chips. Indeed, the typical dimensions of on-chip single mode high index contrast integrated waveguides are on the order of a hundred, or a few hundreds of nm, while the typical dimensions of fiber optic cores are on the order of 10 μm (for single mode fiber) to a few tens of μm. This creates a dual problem of having to focus light from an optical fiber down to the dimensions of on chip high-index contrast waveguides and of having to precisely align the position of the optical fiber relative to the semiconductor chip.

A similar problem arises when directly coupling a semiconductor laser chip containing a laser diode to a primary photonic chip containing other optical devices such as single mode waveguides or modulators. While the dimensions of a semiconductor laser beam, such as is generated by a typical DFB laser or a typical Fabry-Perot laser, is typically much smaller than that of an optical fiber and more closely matched to the dimensions of high index contrast waveguides on the primary photonic chip, alignment constraints are even more stringent and need to be in the μm or sub-micron range. The typical beam dimensions of a semiconductor laser are on the order of 1 μm in the vertical direction, the dimension perpendicular to the laser chip surface, and on the order of 1 to a few tens of microns in the in-plane dimension.

Several methods have been demonstrated to couple light to and from a primary photonic chip with micron sized or sub-micron optical waveguides. One method consist in coupling to a waveguide from the top of the photonic chip, for example by using grating couplers as is taught in U.S. Pat. Nos. 7,068,887 and 7,260,289. This method has the advantage of relaxing required alignment tolerances since the waveguides on the primary photonic chip are tapered and broadened inside the grating coupler, or prior to routing to the grating coupler. This way a much larger beam is produced that is easier to align to. However, such grating couplers also induce other constraints. For one, such coupling schemes often only work for one polarization, or when they work for two polarizations they create additional complications such as the necessity of two photonic chip waveguides with uneven coupling from the fiber to the two waveguides depending on the state of polarization of the light. These methods are also poorly suited for direct coupling from a laser diode to a primary photonic chip, since the dimensions of the laser beam are significantly smaller than the grating coupler dimensions in at least one dimension, as the typical dimension of the laser beam in the direction perpendicular to the laser diode chip surface is on the order of 1 μm and typical grating coupler dimensions are of at least several microns. Finally, grating couplers are finite bandwidth devices that require tight control of the laser linewidth.

Other methods have been taught that rely on coupling light from and to the primary photonic chip by coupling light from above the photonic chip into the photonic chip through the surface of the photonic chip. An alternative to grating couplers is taught in U.S. Pat. No. 7,308,166. However, constraints relative to uneven coupling depending on polarization and stringent alignment tolerances remain. Couplers are either matched to beams that are much larger than the 1 μm typical dimension of a laser diode beam or alignment tolerance have to be submicron in at least one dimension in order to obtain high coupling coefficients.

Constraints relating to stringent alignment tolerances are difficult to satisfy and lead to high manufacturing costs not only because the alignment has to be established during assembly, but also because alignment has to be maintained after assembly, thus requiring very stable and reliable optical packaging solutions and leading to yield fallout.

An alternate method to couple light to and from a photonic chip consists in butt-coupling. Butt-coupling consists in routing a photonic waveguide all the way to the edge of the chip or to create a waveguide edge by other means, hereafter called the chip interface. Light can then be focused onto the waveguide cross-section at the chip interface of the photonic chip or light can then be collected from the waveguide cross-section at the chip interface. This method is generally more robust to polarization diversity since light is directly coupled without an interposed polarization sensitive coupling device. However, this method suffers from the fact that alignment tolerances are directly determined by the dimensions of the waveguide cross-section at the chip interface and are typically sub-micron for high index contrast waveguides. Also, assembly can be complicated due to the fact that the edge of the chip offers very little area to permanently attach a fiber or a laser, as opposed to the chip surface in the prior methods that allow permanently gluing a fiber, fiber array, laser diode, laser submount or optical bench to the chip surface. For this reason, it is typically required with edge coupling to position and attach both the primary photonic chip and the second optical element onto a common substrate, e.g. the optical package or an optical submount, in such a way such that the alignment between the primary photonic chip and the second optical element is maintained. This requires stringent control of the dimensions of the primary photonic chip, the second optical element and the common substrate as well as of the alignment tolerances between these elements.

A typical example of butt-coupling is the permanent coupling between a semiconductor laser diode and a tapered fiber in a butterfly package. This is a very costly packaging technology. In particular, the fiber is held in place by a metallic clip. The position of the fiber relative to the laser is adjusted by laser hammering, a process in which the metallic clip is repeatedly adjusted by subjecting it to a high power laser beam that thermally distorts the metallic clip.

In order to relax required alignment accuracies, it is common practice to taper the waveguide at the edge of the chip, that is, to progressively widen the waveguide while it approaches the chip interface. While it is straightforward to widen the waveguide in the direction along the chip surface, by simply drawing a wider lithographically defined waveguide, it is much more difficult to taper a waveguide in the vertical direction perpendicular to the photonic chip surface since in the latter case the dimensions are determined by the dimensions of deposited thin film layers. Thin films typically used in semiconductor chips, such as silicon, polysilicon or silicon oxi-nitrides in the case of silicon based photonics are both difficult to fabricate with slanted cross-sections for tapering in the vertical direction and to deposit in thick enough layers to match an optical fiber cross-section. For both these reasons many implementations of tapered waveguides in the vertical direction rely on organic materials such as for example SU8. This is taught in "Fiber-Core-Matched Three-Dimensional Adiabatic Tapered Couplers for Integrated Photonic Devices" by Chun-Wei Liao et al., IEEE Journal of Lightwave Technology, Vol. 29, Nb. 5, page 770, Mar. 1, 2011.

Another form of taper is an inverse taper in which the waveguide cross-section of a dielectric waveguide is reduced while it approaches the chip interface, down to a cross-section well below the dimensions at which the waveguide first becomes single mode. The waveguide mode is poorly confined by a dielectric waveguide with such a small cross-section and expands again. This form of taper has the advantage that tapering in the horizontal direction can lead to both increased vertical and horizontal mode dimensions. The primary difference between a regular, i.e., non-inversed taper and an inversed taper is that in a regular taper the waveguide cross-section is increased, typically larger than a maximum waveguide cross-section such that the waveguide remains single mode, in order to expand the mode profile, while in an inverse taper the waveguide cross-section is decreased, typically smaller than a maximum waveguide cross-section such that the waveguide remains single mode, in order to also expand the mode profile.

State-of-the-art packaging methods with submicron or micron sized alignment accuracies typically rely on active alignment, a method in which light is coupled between the waveguide of the primary photonic chip and the second optical element during alignment and/or during attachment in order to monitor the quality of the alignment in real time. The quality of the alignment as given by the optical coupling efficiency is then used as feedback information in order to adjust the alignment. This method can result in technical constraints. For example, when aligning a photonic chip to a semiconductor laser diode, the semiconductor laser diode has to be operated during attachment. This complicates manipulation of the laser diode as it has to be electrically contacted and it constrains the alignment process as the diode has to remain cold enough in order to be operated. These constraints are taught in U.S. Pat. Nos. 6,559,464 and 6,970,628.

Chip placement accuracy in automatic pick and place systems can be as good as ±1.5 µm without active optical alignment in state-of-the-art commercial systems relying primarily on machine vision. However, this tolerance remains too high to passively butt-couple a typical semiconductor laser to a high index contrast waveguide. A typical off-the-shelf single mode laser diode as used in typical telecom or datacom systems has a horizontal beam width, i.e., a beam width along the surface of the chip, that is also on the order of one micron to at most a few micrometers. In this case, a misalignment by 1 or a few microns in the horizontal direction due to the tolerance of a passively aligned pick-and-place system very adversely effects the coupling efficiency between the laser diode and a waveguide located on the primary photonic chip.

Alignment accuracies can be relaxed by tapering a single mode waveguide on the primary photonic chip to a wider cross-section in the horizontal direction while approaching the photonic chip interface, as explained above. Tapering the horizontal dimension to a much wider width than the width of the laser beam significantly relaxes the required alignment tolerance, but also reduces the coupling efficiency obtained under optimum coupling conditions if the laser beam width is not increased accordingly, hence there is a trade-off between the peak coupling efficiency and the required alignment tolerance. This is caused by the fact that widening of the waveguide without widening of the laser beam results in a mode overlap mismatch that reduces the coupling efficiency in a single mode system, i.e., in a system where the coupled to waveguide on the primary photonic chip is single mode for at least a portion of its path.

The trade-off between the required alignment tolerance and the peak coupling efficiency can be relaxed by also widening the width of the laser beam, since a good mode overlap is then recovered. In principle, widening the width of the laser beam can be easily obtained in the horizontal direction by defining a wider laser strip on the laser diode chip, since dimensions in the horizontal direction are easily controlled by lithographic definition. This approach is however limited both by technical and economic considerations. Widening of the laser strip can lead to filamentation, a mechanism by which a semiconductor laser loses its single mode behavior in the spatial domain. This is taught in "High-Power Angled Broad-Area 1.3-µm Laser Diodes with good Beam Quality" by Chih-Hung Tsai et al., IEEE Photonics Technology Letters, Vol. 16, Nb. 11, page 2412, November 2004. Filamentation can result in a complex laser beam profile that can also change over time, both of which prevent efficient coupling of the laser beam into single mode photonic waveguides on the primary photonic chip. Widening the laser strip in conventional technology can also be difficult since it can make it harder to efficiently and homogenously electrically pump the laser beam.

Other methods to increase the width of the laser beam, such as tapering the laser strip close the edge of the laser chip typically results in increased manufacturing cost. Since the optical gain material on the laser diode chip results in high optical losses when it is not pumped, and since pumping it efficiently in the broadened laser strip region is both technically challenging and leads to excess current consumption, it is typically necessary to selectively remove the laser gain material in the tapered region and to selectively regrow another material in its stead. This is a very expensive and typically poorly yielding process.

Moreover, conventional off-the-shelf telecom grade laser diodes are often meant to be coupled to a tapered fiber. In this case, it is very desirable for the laser mode to have a circular beam pattern, since the tapered fiber also has a circular beam pattern and needs to be mode-matched to the laser. For this reason, off-the-shelf semiconductor lasers are often optimized to have a vertical beam dimension that is similar to the horizontal beam dimension. While it is possible to manufacture lasers with horizontal beam sizes specifically tailored for another coupling scheme, it is more cost efficient for the primary photonic chip to be compatible with preexisting off-the-shelf laser diodes.

In addition to the horizontal alignment accuracy, the problem of vertical alignment accuracy also has to be addressed. One possibility is to flip and attach the semiconductor laser chip onto the top of the primary photonic chip, but to first partially etch into the primary photonic chip so as to create a waveguide edge by etching through the waveguide and so that the laser beam is vertically aligned with the waveguide edge of the primary photonic chip. The laser is attached to the primary photonic chip in the etched through region, so that the relative alignment is controlled by the depth of the etch. This is taught in "Hybrid Integration of InP Lasers with SOI Waveguides Using Thermocompression Bonding" by M. Kapulainen et al., Proceedings of the 5th IEEE International Conference on Group IV Photonics, pages 61-63, 17-19 Sep. 2008. With butt-coupling the chip interface is often the edge of the chip. However in this variant of butt-coupling the interface of the primary photonic chip is not the edge of the chip itself, but the edge defined by the etch. The top of the chips is the side of the chips on which the relevant photonic devices are fabricated.

In this method, the vertical alignment between the laser and the waveguide on the primary photonic chip is determined by thin film layer thicknesses on the primary photonic chip and on the laser chip, by the etch depth into the primary photonic chip and by the attachment process used to attach the laser chip to the primary photonic chip. Thus, in principle, the vertical alignment between the laser beam and the waveguide on the primary photonic chip can be controlled with a high level of accuracy.

In practice, however, the vertical alignment accuracy is limited by the attachment process. Some alignment processes such as covalent bonding or anodic bonding result in a very high vertical attachment accuracy since the two chips are directly attached to each other without interposing an additional adhesive or bonding layer. However, they also require ultra planar surfaces on both the laser chip and on the photonic chip. Off-the-shelf laser diodes typically have a non-flattop chip surface due to the definition of the laser strip (or other forms of laser cavities) and to the definition of top electrodes, the top surface of the laser chip being the chip side on which the laser cavity is defined. Anodic or covalent bonding also require extremely clean chip surfaces and cleanroom environments with very low particle counts. With these bonding methods electrical contacting between the top surface of the laser chip and the top surface of the photonic chip is also complex since the adhesion does not occur via a conductive layer. Other methods such as eutectic or thermo-compressive metallic bonding of the laser diode require less planarity, are more particle tolerant and facilitate electrical contacting of the laser diode. They result however in degraded vertical alignment accuracy on the order of a few 100 nm, since the bonding layer can get more or less compressed. At the extreme, controlled collapse bump bonding is very tolerant to high particle count (dust) and non-planar topographies, but results in very poor vertical alignment control, with tolerances of at least one to several micrometers.

As with horizontal alignment tolerances, vertical alignment tolerances can be relaxed if the waveguides in the photonic chip are larger in the vertical direction. As with horizontal alignment tolerances, this alignment tolerance relaxation method is limited by the fact that a vertical waveguide dimension substantially larger than the vertical laser beam dimension leads to reduced overlap and reduced peak coupling efficiency.

The difficulty in coupling to a single mode waveguide located on a primary photonic chip from an incoming input light beam external to the primary photonic chip results from the reciprocity principle. The coupling efficiency is identical to the overlap of the time-reversed version of the input beam with the uniquely defined beam created by shining light out of the single mode waveguide. A misalignment of the input beam on the same order than the full width at half maximum of the input beam will thus lead to a substantial reduction of coupling efficiency if the input beam is well matched to the waveguide mode. On the other hand, in the case of a multi-mode waveguide the coupling efficiency from the input beam to the waveguide is equal to the overlap between the time reversed version of the input beam and the best possible linear superposition of beams created by shining light out of the waveguide for each of the modes supported by the waveguide. In such a case, the waveguide cross-section can be made much bigger than the input beam without penalty in maximum coupling efficiency, since the mismatch is compensated by the degrees of freedom afforded by the multi-mode nature of the waveguide. The degrees of freedom afforded by the multi-mode nature of the waveguide also allow maintaining a high coupling efficiency even for substantial displacements of the input beam. In general, in order to maintain high coupling efficiency from an optical element A to an optical element B, the light carried in optical element B needs to have as many degrees of freedom as the light carried by optical element A, including those resulting from displacing the relative position of optical element A.

SUMMARY OF THE INVENTION

The invention is an apparatus that allows cost effective and efficient coupling of light between a primary photonic chip and a second optical element such as a laser, a planar lightwave circuit or another photonic chip. In one embodiment the second optical element is one out of a DFB laser diode and a Fabry-Perot laser diode.

The apparatus allows the relaxation of the horizontal alignment accuracy such that assembly can occur with passive, machine vision guided alignment, or can occur with active alignment but with increased yield and coupling efficiency.

In a first and second aspect, the coupling occurs between a laser diode or another second optical element sending an input beam onto the primary photonic chip and more than one single mode optical paths on the primary photonic chip, wherein a single mode optical path is defined as having at least one single mode waveguide section on the primary photonic chip or as having at least one single mode waveguide section (including single mode fiber) after being coupled off the primary photonic chip.

In a first and second aspect, the apparatus utilizes the fact that several single mode optical paths taken together are multimode in nature, in that light coupled to the ensemble of optical paths has more than one degree of freedom and is described in a multi-dimensional vector space. These degrees of freedom correspond to the amplitude and phase of the light transported by each of the single mode optical paths. They allow to efficiently couple light from a single laser diode to the ensemble of single mode optical paths on the optical chip even when the laser diode is misaligned. This occurs without breaking the reciprocity principle by mapping the misalignment of the laser diode onto the internal degrees of freedom of the ensemble of single mode optical paths.

In a first aspect more single mode optical paths are defined on the chip than are later utilized in the finished good. Depending on the alignment of the attached laser, single mode optical paths that receive a sufficient amount of light to be functional are selected and later utilized in the finished good. This selection occurs by powering up the laser during a step of the manufacturing process and by inspecting the single mode optical paths for functionality or it occurs during operation or boot-up of the finished good if the finished good is a reconfigurable system.

In a second aspect, a multi-mode section is located on the primary photonic chip between the interface of the primary photonic chip and a location on the primary photonic chip where the multi-mode section is divided up into independent single mode optical paths, wherein independent single mode optical paths are defined as single mode optical paths that are not substantially coupled to each other, for example independent waveguides. In this aspect, the multi-mode section converts the input beam provided by the second optical element into a beam profile with an intensity distribution that is substantially independent of the misalignment of the second optical element and of the input beam, provided said misalignment remains within the allowable misalignment limits defined in the manufacturing process. The misalignment is rather converted into a distortion of the phase front of the converted beam, such that the reciprocity principle can be verified by allowing for sufficient degrees of freedom to account for the displacement of the input beam. The converted beam is locally picked up by independent waveguides, so that a slowly varying phase front distortion of the converted beam does not substantially impact the amount of light coupled into the individual waveguides. With help of the functionality of this multi-mode section, the allowable misalignment limits of the manufacturing process can be substantially increased compared to the misalignment limits required for the assembly of a finished good without this multi-mode section.

The functionally of the multi-mode section as previously described is verified by a multi-mode interferometer whose dimensions are carefully chosen, as described below.

Since the first and second aspects require several single mode optical paths to be defined on the primary photonic chip with typically more than one of the several single mode optical paths carrying a substantial portion of the light supplied by the input beam, these aspects are particularly well suited to parallel optics transmitters. Another system for which this is particularly well suited is a system where the second optical element is a multi-wavelength laser such as a comb laser and the several single mode optical paths on the primary photonic chip are used as part of an arrayed waveguide grating used to separate individual frequency components generated by the multi-wavelength laser. Another system for which this is particularly well suited is a system where at least two of the several single mode optical paths on the primary photonic chip are part of a Mach-Zehnder Interferometer based switch or modulator. These embodiments are described below.

In a third aspect, the photonic chip is fabricated with silicon-on-insulator (SOI) material. In this aspect the assembly of the laser chip with the primary photonic chip is implemented in a way that allows accurate vertical alignment of the laser beam to the optical devices on the primary photonic chip, is tolerant to dust, and allows efficient heat sinking of the laser chip. The details of this aspect are described further below. This aspect can also be used independently of the other aspects of the invention, in that it can also be used when the laser is coupled to a unique single mode optical path on the photonic chip, or if it is coupled to a multi-mode optical path on the photonic chip or any combination of single mode and multi-mode optical paths.

Even though the second optical element to which the primary photonic chip is coupled to is often referred to as being a semiconductor laser chip in the description of the invention, it is understood that it can also correspond to other categories of optical elements, such as for example another photonic chip or photonic lightwave circuit. For example, the second optical element can be a passive planar photonic lighwave circuit transporting light to or from the primary photonic chip. It is also understood that the primary photonic chip is defined as comprising photonic devices, but can also comprise other categories of devices such as transistors, other electronic devices or even complex analog, digital or mixed signal circuitry.

DETAILED DESCRIPTION OF THE INVENTION

Figure 1:
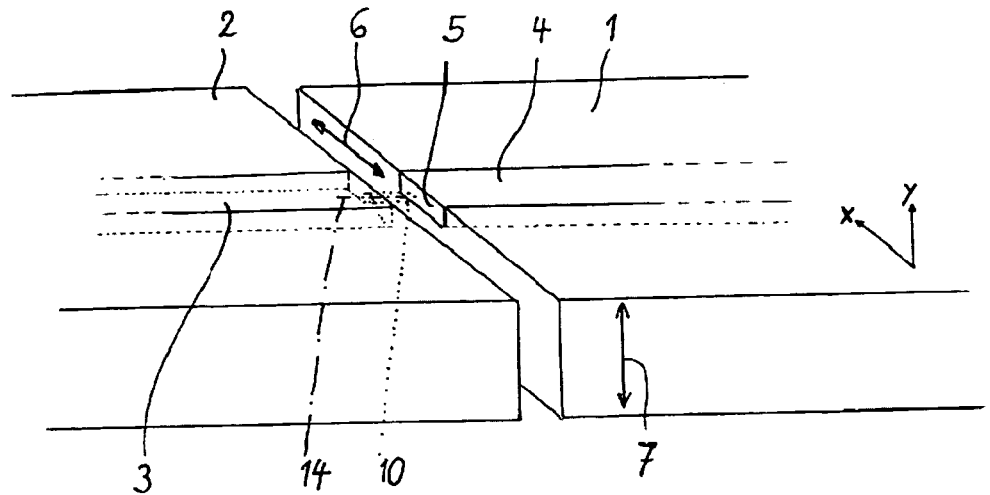
FIG. 1 shows a perspective side view of a second optical element butt-coupled to a primary photonic chip such that an optical beam is coupled from a photonic device of the second optical element to a coupling apparatus of the primary photonic chip.

In a first aspect several waveguides are routed to the interface of the primary photonic chip in a manner such that they can collect light from an input beam provided by the second optical element. At the chip interface, the array of waveguides typically cover a width that is wider than the input beam so as to fully collect the input beam and to provide some margin for lateral (horizontal) displacement of the input beam.

Independent waveguides are defined as being separated with a sufficient distance from each other such that the coupling between adjacent independent waveguides is negligible. For a silicon waveguide of dimensions 400 nm width by 200 nm height this distance is for example typically on the order of 1 to 2 microns. In an array of independent waveguides the area coverage of waveguide cores in the cross-section of the array is relatively low, so that if such an array were to collect light from an input beam, only a small portion of the light from the input beam would be collected. For this reason the spacing between adjacent waveguides at the chip interface is typically closer, such that adjacent waveguides are substantially coupled to each other. While the waveguides are routed away from the chip interface they are typically also progressively separated from each other until the coupling between adjacent waveguides becomes negligible and the waveguides become independent from each other. The region where the waveguides are highly coupled to each other is functionally equivalent to a multi-mode section or to a wide multi-mode slab waveguide.

Coupling between the input beam and the waveguide array can be further facilitated by additional coupling structures hereafter referred to as the waveguide array transition. For example, the waveguides can be tapered close to the interface of the primary photonic chip.

Such tapers can take the form of progressive widening of the waveguides while approaching the interface of the primary photonic chip. For example, such widening of the waveguides can occur to the extent where the waveguide cladding regions separating the waveguides completely disappear and the waveguides merge into a single slab region. The widening can also be partial in that some portion of the cladding regions separating the waveguides remain up to the chip interface.

Such tapers can also take the form of inverse tapers. In this geometry, the horizontal dimension of the waveguides cores, i.e., the dimension along the surface of the photonic chip, is progressively decreased while they approach the chip interface. This decrease can be to the extent where the waveguide cores completely disappear. This decrease can also be partial in that a non-vanishing waveguide core is routed all the way to the interface of the photonic chip.

A waveguide array transition with inverse tapers can also be embedded within an additional auxiliary waveguide with a lower index core than the refractive index of the core of the individual waveguides constituting the waveguide array. For example, silicon waveguides with a core index of 3.43 can be inverse tapered while being embedded in an auxiliary silicon oxi-nitride waveguide with a refractive index between 1.46 and 2.1, which in turn can be partially embedded within silicon dioxide with a refractive index of 1.46, silicon oxi-nitride with a different stoichiometry and a lower refractive index than the inner oxi-nitride or air. Such a structure allows guiding of the light within the auxiliary waveguide while the primary waveguides are being tapered, so that the light can be progressively coupled from the auxiliary waveguide to the primary waveguides.

Figure 5:
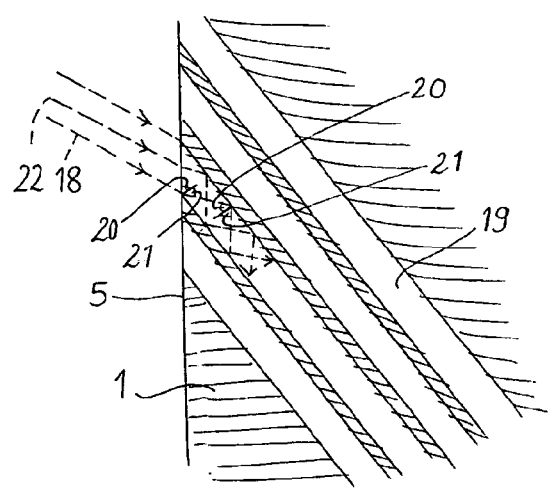
FIG. 5 shows angles of the waveguides constituting the waveguide array of FIG. 4.

The waveguide array can also be routed towards the chip interface with a non orthogonal angle relative to the chip interface. If this angle is well adjusted, this can allow reducing the insertion losses from the input beam to the waveguide array. This can for example be seen by a ray approximation as shown in FIG. 5. This angle can also be determined numerically by simulating the waveguide array transition with different such angles. This angle can be chosen in such a way that the two primary Fourier components of the waveguide mode profile are substantially converted into a single Fourier component outside the waveguide array as is shown in FIG. 5.

At the input interface of the primary photonic chip, at least a subset of the individual waveguides are typically close enough to each other to be substantially coupled to each other. If the distance between the waveguides is large enough so that the waveguides are substantially independent and not coupled to each other, the spacing between the waveguide is large, so that a large portion of the incoming optical beam is lost. Tight packing of the waveguides allows a high spatial overlap of the waveguide cores (or equivalently waveguide modes) with the incoming optical beam. Typically, waveguides will be placed in such a way that the spacing between adjacent waveguides, defined as the distance between the points where the field intensity of the waveguide modes has decayed below 50% of the maximum field intensity of the waveguide mode, is less than 100% of the width of the smaller of the adjacent waveguide cores or smaller than 100% of the smaller full width at half maximum (FWHM) of the intensity distribution of the waveguide modes of the adjacent waveguides. In this case the waveguides are considered at least very strongly coupled to each other. In order to further reduce insertion losses at the input interface of the primary photonic chip, it is desirable to decrease this distance below 50% of the smaller of the adjacent waveguide cores or below 50% of the smaller FWHM of the waveguide modes of the adjacent waveguides. In this case the waveguides are considered at least extremely strongly coupled to each other. The FWHM of the intensity distribution of the waveguide modes refers to the FWHM in the horizontal direction. Specifically, the horizontal intensity distribution of a 2D waveguide mode, i.e., of a waveguide mode having an extent in both the horizontal and the vertical directions, is defined at each point in the horizontal direction as the integral in the vertical direction of the square of the magnetic field. This reduces a 2D mode profile into a 1D horizontal intensity distribution. By taking the square of the magnetic field rather than the Poynting vector, the intensity distributions are smooth even for high index contrast dielectric waveguides so that an unambiguous determination of the FWHM is obtained.

After singulation into independent waveguides, at least some of the waveguides correspond to independent single mode optical paths as previously defined.

Single mode optical paths are considered strongly coupled to each other at the input interface of the primary photonic chip if they are merged into a single multi-mode section or if they correspond to individually defined waveguides that are strongly coupled to each other. Waveguides with identical cross-sections are considered at least strongly coupled to each other if the coupling length required to fully couple the light from one waveguide to the other is less than 200 µm. For asymmetric waveguides, waveguides are considered at least strongly coupled if their coupling coefficient κ is more than 0.0078 µm$^{-1}$. The coupling coefficient is defined such that $$\frac{dA}{dz} = i\kappa B + i k_A A$$

$$\frac{dB}{dz} = i\kappa A + i k_B B$$

where z is the direction of propagation, A and B are the complex amplitudes of the two waveguide modes, $k_A$ and $k_B$ are the wave numbers of the two modes, and the two modes are normalized in such a way that κ is a real number that is identical for coupling from mode A to mode B and from mode B to mode A. This is for example the case when the two modes are normalized in such a way that A=1 or B=1 respectively correspond to a power of 1 Watt transported by the corresponding waveguide. Two waveguides are considered at least very strongly coupled if light fully couples from one waveguide to the other over a distance smaller than 100 µm or if κ is larger than 0.0157 µm$^{-1}$. Two waveguides are considered at least extremely strongly coupled if light fully couples from one waveguide to the other for a distance smaller than 50 µm or if κ is larger than 0.03 µm$^{-1}$. Extremely coupled to each other is a stronger coupling than very strongly coupled to each other, which is a stronger coupling than strongly coupled to each other.

Prior to being routed off the primary photonic chip, additional functionality can be added to the single mode optical paths. For example, in the implementation of a parallel transmitter, each single mode optical path or a subset of the single mode optical paths can be provided with an optical modulator that allows applying data to the light transported in the single mode optical paths.

The single mode optical paths can also be routed off the photonic chip without additional active functionality added to the single mode optical paths. This would for example be the case if the primary photonic chip is used as a packaging element to only connect a laser to an array of fibers without additional functionality.

The single mode optical paths can be eventually routed off the primary photonic chip. For example in the implementation of a parallel transmitter the single mode optical paths can be coupled directly or indirectly, i.e. via additional optical elements other than the primary photonic chip, to single mode or multi-mode optical fibers. These fibers can be connected on the other end to an optical receiver. The single mode optical paths are routed off the primary photonic chip via output interfaces of the primary photonic chip, via output ports of the primary photonic chip or via exit areas of the primary photonic chip, wherein output interfaces of the primary photonic chip, output ports of the primary photonic chip and exit areas of the primary photonic chip are synonymous to each other.

The output interface or output interfaces of the single mode optical paths between the primary photonic chip and further optical elements can occur via another type of apparatus than at the input interface. For example, output interfaces can be realized via grating couplers. These grating couplers can couple light to an array of optical fibers by aligning and attaching an optical fiber array above the primary photonic chip. It can be desirable to use a different type of apparatus at the output interface or at the output interfaces than at the input interface, since at the output the dimensions of the coupled to optical elements can be very different from the dimensions of the optical input beam at the input interface. For example, single mode optical fibers and multi-mode optical fibers have much larger mode profiles than typical semiconductor lasers.

In the first aspect, not all the single mode optical paths play a role in the finished good depending on the exact alignment and attachment of the second optical element such as the laser diode chip relative to the primary photonic chip.

In some embodiments, after alignment and attachment of the second optical element, the single mode optical paths can be tested for functionality. A typical way of testing a single mode optical path for functionality is to measure the amount of optical light routed to the corresponding output interface of the primary photonic chip in the presence of the input beam at the input interface of the primary photonic chip in order to determine whether sufficient optical power is transmitted at the corresponding output interface in order to be functional. The optical power can be measured with a measuring apparatus that comprises a single mode optical path, in order to only measure the optical power contained in a specific field profile. The input beam at the input interface of the primary photonic chip can be provided by powering up the laser diode when the second optical element is a laser diode chip. When the second optical element is a planar lightwave circuit or another photonic chip, the input beam at the input interface of the primary photonic chip can be provided by sending light through the input port of the second optical element such that light is routed to an output port of the second optical element and coupled to the input port of the primary photonic chip.

Depending on which output ports of the primary photonic chip are functional, the assembly of the finished good can be adjusted, in that the connectivity of the output ports of the primary photonic chip to the rest of the system is adjusted accordingly. For example, the position of a fiber array attached to the primary photonic chip can be adjusted such that the fibers are coupled to a set of output ports of the primary photonic chip that are each functional, or such that it maximizes the number of fibers that are coupled to functional output ports of the primary photonic chip. This is facilitated by the fact that typically functional output ports of the primary photonic chip tend to be adjacent to each other. This is due to the fact that at the input interface of the primary photonic chip, waveguides that receive sufficient light are each within the cross-section of the input beam and thus adjacent to each other, and can be routed to the output ports of the photonic chip is such a way that the corresponding output ports are also adjacent to each other.

The selective placement of a fiber array on the primary photonic chip is an example in that the same principle can be applied to another outcoupling apparatus. For example, the position of a planar lightwave circuit used to route light away from the primary photonic chip can be adjusted according to the position of the functional output ports of the primary photonic chip. The optical element whose position is adjusted according to the position of the functional output ports of the primary photonic chip is called the third optical element.

The output ports of the primary photonic chip can also be connected to the rest of the system via butt-coupling, for example by butt-coupling to tapered optical fibers. Such tapered optical fibers can be individually placed tapered optical fibers or an array of tapered optical fibers, in which case the array of tapered optical fibers can be the third optical element.

The selective connectivity can also occur at a later point of the system, for example all the output ports could be connected to fibers, but only a subset of the fibers connected to further elements such as receivers. Or the primary photonic chip could be attached to a planar lightwave circuit with a fixed position relative to the primary photonic chip, which is itself connected to a third optical element in the form of a fiber array with a position that is adjustable in the assembly flow.

In an optical communication system, this results in an apparatus in which a third optical element is positioned and attached or spliced in so as to collect, transmit or detect light directly or indirectly from a subset of output ports of the primary photonic chip in such a way that the number of resulting functional communication channels is maximized, or in a way such that the link margin of the resulting communication channels are maximized relative to other positions of the third optical element that result in other overall connectivity.

In another embodiment of the first aspect, the selective connectivity of the output ports of the primary photonic chip is not determined by the permanent attachment of a third optical element, but is determined by reconfigurability of the finished good. Such reconfigurability of the finished good can be obtained by moving parts within the system but also by adaptive electronics. For example a subset of receivers can be activated or can be declared as being functional depending on the amount of received light. This configuration can be dynamic in real time or can be implemented at specific times such as reset or boot-up of a subsystem. Receivers that are not operational due to the fact that they do not receive sufficient light due to the alignment of the second optical element relative to the primary photonic chip can be partially or fully powered down in order to save power. This configuration can be particularly relevant to the implementation of an active optic cable.

Another type of reconfigurability can be implemented in the form of a reconfigurable optical element on the primary photonic chip that can selectively switch waveguides coming from the interface of the primary photonic chip to waveguides going to further elements of the primary photonic chip such as modulators or output ports. Such a switch fabric removes the necessity to duplicate the further elements such as modulators since the waveguides carrying most of the light can be routed to these elements. Such a reconfigurable optical element can also comprise combiners to combine light from several waveguides coming from the input interface of the primary photonic chip.

A dynamic reconfigurability allows for example adjusting for temperature dependent displacement of the attached second optical element such as the laser diode chip relative to the primary photonic chip due to thermal expansion coefficients of utilized materials, thus further relaxing the constraints related to the attachment process.

In some embodiments, the primary photonic chip is realized out of silicon on insulator (SOI) material. In such embodiments, at least a portion of the waveguide cores or at least a portion of the single mode optical paths is made out of the top silicon layer of the initial SOI material, i.e. out of the single crystalline silicon located directly on top of the oxide located directly on top of the silicon wafer handle (also called bulk silicon or silicon substrate).

In some embodiments, the thickness of the top SOI silicon layer is such that it substantially matches the vertical dimension of the input beam, or is such that it is sufficiently thick to directly collect an acceptable amount of the input light without the need of tapered structures in the vertical direction on the primary photonic chip. In this case the un-etched portions of the top silicon layer of the SOI material are typically on the order of 1 µm thick, are typically at least 500 nm thick and are typically not more than 2 µm thick. This technology is for example particularly well suited when the primary photonic chip plays the role of a passive optical bench that serves to facilitate the coupling of a laser to an array of fibers. In such a technology, waveguides are typically defined by an etch that is much thinner than the total thickness of the top silicon layer of the SOI material so as to allow single mode waveguides.

In some embodiments, the thickness of the top SOI layer is thinner than 500 nm. In such a case, the direct coupling between a typical laser diode taking the role of the second optical element and a typical waveguide defined in the top silicon layer of the SOI material is reduced due to the substantial mismatch between the vertical dimension of the laser beam and the vertical dimension of the SOI waveguide mode. Typical dimensions of single mode waveguides defined in the top SOI layer are for example 300 by 300 nm, 400 by 200 nm, or 400 nm wide in a 200 nm thick silicon layer that is partially etched on the sides of the waveguide core. It is however highly desirable to use such waveguides on the primary photonic chip for some applications. In particular, integrated modulators and photodetectors can be made with much higher performance than in larger silicon waveguides. It is then desirable to vertically expand the waveguide mode profiles in the waveguide array transition.

In some embodiments, waveguides are fabricated in SOI material with a top silicon layer that is typically between 200 nm to 350 nm, thinner than 500 nm and larger than 100 nm. The lower limit of 100 nm silicon is due to the fact that for thinner film thicknesses, waveguides defined in the top silicon tend to be poorly confined throughout the primary photonic chip and to have high substrate coupling losses. In such embodiments, waveguides are inverse tapered close to the input interface of the primary photonic chip. Inverse tapering of such waveguides expands their mode cross-section including in the vertical direction so that they are more closely matched to the cross-section of a beam provided by a laser diode or another second optical element.

In some embodiments, the waveguides are at least partially made out of SOI material and in addition are at least partially embedded in an auxiliary silicon oxi-nitride (including silicon dioxide and silicon nitride) waveguide close to the input interface of the primary photonic chip, so that light can be first collected by the silicon oxi-nitride core surrounded by silicon dioxide or other lower index material (including air or vacuum) and progressively coupled to the silicon waveguides. Typical thickness of the silicon oxi-nitride are chosen to match the vertical dimension of the input beam and are on the order of 500 nm to 2 µm.

A distinguishing aspect of the first aspect is that typically at least two independent single mode optical paths exist after the interface of the primary photonic chip such that each of these at least two single mode optical paths carry a substantial portion of the total optical power of the optical input beam. For example this substantial portion of the total optical power can be at least 20% of the total power from the optical input beam carried by single mode optical paths on the primary photonic chip. Since the horizontal attachment misalignment can be on the order of one or several waveguide widths at the interface of the primary photonic chip, typical embodiments will have between 2 to 10 single mode optical paths each strongly coupled to the adjacent waveguides, with at least 2 of said single mode optical paths carrying a substantial amount of the total power of the input beam. For wider input beams or thinner waveguides, 2 to 8 waveguides can typically carry a substantial portion of the total power of the input beam, defined here as at least 20% of the maximum power from the input beam carried by any of the other single mode optical paths.

In some embodiments, the silicon oxi-nitride of the previously described waveguides are replaced by another material that has a higher refractive index than the surrounding material and a lower refractive index than silicon. This other material can for example be an organic material such as SU-8.

A shortcoming of the first aspect is that more structures have to be defined on the primary photonic chip than are utilized in the finished good. The primary photonic chip has thus to be larger than would otherwise be the case, and is thus more expensive to manufacture.

Another shortcoming of the first aspect is that either the manufacturing flow is more complex than would otherwise be the case since the position of a third optical element has to be adjusted according to which output ports of the primary photonic chip are measured to be functional, or alternatively the finished good has to be more complex than would otherwise be the case since it has to comprise an adaptive mechanism.

A third shortcoming of the first aspect occurs when the input beam does not have a substantially flat-top spatial intensity distribution. For example the intensity distribution is typically close to a Gaussian distribution. Even though the entirely of the input beam may be substantially collected by the waveguide array, the power distribution throughout the waveguides of the waveguide array may be very uneven. It is not a-priori known where the exact location of the input beam will be, since the invention is meant to provide robustness relative to misalignment of the attached second optical element. Thus variations in the intensity profile of the input beam can only be partially compensated by varying the width of the waveguides at the input interface of the primary photonic chip, since the final intensity distribution after misalignment is not a-priori known.

In a second aspect a multi-mode interferometer (MMI) is fabricated in the primary photonic chip. The multi mode interferometer is a multi-mode section that is carefully sized to facilitate coupling of light from the second optical element to the primary photonic chip, with a precise functionality described below. Light is coupled from the incoming optical input beam into the primary photonic chip and into the MMI. After the MMI, light is coupled into independent single mode optical paths at least partially fabricated in the primary photonic chip. Optionally, there may be an additional element on the primary photonic chip between the input interface of the primary photonic chip and the main section of the MMI that facilitates coupling of light into the MMI. This is the MMI input transition.

The transition at the end of the MMI between the MMI and the independent single mode optical paths can take the forms described in the first aspect of the invention and referred to as the waveguide array transition.

The MMI converts the input beam into an output beam at the end of the MMI that can be picked up by a waveguide array at the end of the multi-mode section, such that the MMI output beam is substantially recentered on the center axis of the MMI irrespectively of the misalignment of the input beam or of the second optical element provided said misalignment is within allowable limits. These limits can be defined in the assembly flow and can be wide enough to allow passive pick-and-place assembly of the second optical element with the primary photonic chip. These allowable limits are also substantially wider than in a comparable assembly without the coupling apparatus at the input interface of the primary photonic chip. The MMI can also convert the input beam into an output beam that is substantially flattop (constant intensity profile around the center region of the output beam) irrespectively of the misalignment of the input beam within allowable limits. The MMI can also stabilize the flattop output beam width irrespectively of the misalignment of the input beam within allowable limits. These functionalities are achieved if the dimensions of the MMI follow the rules described in the following. This functionality is particularly well illustrated by FIG. 13.

The MMI output beam intensity is decaying at its edges, but here too it is possible for this decay to be substantially fixed irrespectively of the misalignment of the input beam within allowable limits, provided the MMI dimensions follow the given set of rules. This is particularly well illustrated by FIG. 13 in which the intensity distribution on the sides of the output beam at the end of the MMI is substantially identical irrespectively of the misalignment of the input beam within allowable limits.

The addition of the MMI to the incoupling scheme removes some of the shortcomings of the first aspect of the invention. A flattop MMI output beam allows picking up the light with a waveguide array in such a way that the light coupled to each of the waveguides is substantially constant in the region of the waveguide array overlapping with the flattop region of the MMI output beam. In the region where the MMI output beam decays it is also possible to compensate for this decay by adjusting the width of the waveguides picking up the MMI output beam when the amount of intensity decay is known a-priori, as is the case due to the functionality of the MMI. Recentering the MMI output beam removes the necessity to duplicate structures on the primary photonic chip. Rather, it can be possible to guaranty by design that each of the relevant single mode optical paths are provided with sufficient optical power to be functional.

The functionality of the MMI does not break the reciprocity principle. Rather than converting misalignment of the input beam into distortion of the intensity profile of the MMI output beam, it substantially converts these misalignments into a phase front distortion. If this phase front distortion is sufficiently slowly varying in order to be approximately constant across the waveguide cross-sections at the output of the MMI it has a negligible impact on the amount of light coupled into each of these waveguides.

An MMI can create multiple copies of its input beam at its output if its length is adequately sized. The number of copies also depends on its length. This is a well known fact to one skilled in the art and is also taught in "Optical Multi-Mode Interference Devices based on Self-Imaging: Principles and Applications" by Lucas B. Soldano et al., IEEE Journal of Lightwave Technology, Vol. 13, Nb. 4, April 1995. In particular, N images of the input beam are created at the output of the MMI if the length of the MMI is approximately $L(p,N) = 3pL_\pi/N$, where p is an integer such that p and N have no common divisor and $L_\pi$ is the beat length of the two lowest modes, $L_\pi = \pi/(\beta_0 - \beta_1)$, where $\beta_0$ and $\beta_1$ are the wave numbers of the lowest and the second lowest mode (i.e. the two modes with the highest effective indices). $L_\pi$ is also the shortest distance such that an MMI of length 3 $L_\pi$ creates a single image of an arbitrary input (i.e., without restricted mode excitation) at its output. However, in order to obtain well defined images of the input beam at the output of the MMI, the input beam also has to be sufficiently narrow such that the output images are spatially separated at the output. Otherwise, overlapping images at the output of the MMI will not accurately reproduce the intensity distribution of the input beam.

$L_\pi$ can be approximated as $4n_{eff}W^2/(3\lambda_0)$ where $n_{eff}$ is the effective index of the slab constituting the MMI, W is the width of the MMI (i.e., along the horizontal direction of the MMI cross-section) and $\lambda_0$ is the wavelength in vacuum. This formula is approximate since it is derived for a slab waveguide with metallic boundaries. In a dielectric waveguide as is typically used for the apparatus described here, additional effects such as the Goos-Hanchen effect come into play and slightly modify $L_\pi$ from the value predicted by the formula. It remains however a good initial guess, that can be corrected by further refinement of the analytical formulas or by numerical calculations. The definition of $L_\pi$ based on $\beta_0$ and $\beta_1$ remains valid in all cases. In the following a multi-mode slab waveguide refers to a waveguide made out of a slab, with said waveguide having a finite but sufficiently wide width (in the horizontal direction) to support multiple modes with different mode patterns (i.e. number of lobes) in the horizontal direction. This waveguide may support only modes with the same number of lobes in the vertical direction (i.e., it may be single mode in the vertical direction) or it may support modes with different number of lobes in the vertical direction (i.e., it may be multi-mode in the vertical direction). Particularly for wide MMIs, with a width exceeding a few μm, the two formulas are almost equivalent since the excess effective MMI width due to the Goos-Hanchen effect is small relative to the physical width of the MMI.

In order to obtain the above-described MMI functionality, the MMI is rather sized so as to create multiple overlapping images at its output. These overlapping images taken together can result in an output beam that has the desired properties. In order to obtain overlapping images, there is a first set of constraints on the MMI width: If the MMI is too narrow, it will only capture a fraction of the input beam and lose a lot of light. If the MMI is too wide, given an image plane with a fixed number of images, it will create multiple distinct images of the input beam at its output rather than creating a smooth intensity profile and will not fulfill its intended functionality. Distinct images of the input beam move together with the position of the input beam, so that spatially non-overlapping distinct images cannot fulfill the intended functionality.

Numerical investigations show that when the width of the MMI is more than 10 times larger than the full width at half maximum of the input beam intensity (FWHM) at its waist, the scheme efficiency typically deteriorates rapidly. This is due to the fact that images of the input beam are separate and form complex intensity profiles at the output of the MMI. Image planes with a sufficient number of images such that images still overlap for such a narrow input beam relative to the MMI width also tend to work poorly because the positions of images are very unevenly distributed on these image planes such that a homogenous intensity distribution is not achieved. Furthermore, the large number of overlapping images results in a rapidly varying phase front that decreases coupling efficiency into waveguides at the output of the MMI. Numerical investigations show that when the width of the MMI is 20 times larger than the FWHM of the input beam at its waist, the scheme typically does not work at all. The same definition for the horizontal FWHM of a 2D mode profile is used here as used above. Discussions about the FWHM of the input beam refer to the FWHM in the horizontal direction by default.

When the FWHM of the input beam is more than 9/10 of the width of the MMI, the scheme deteriorates since a substantial portion of the input beam does not overlap with the MMI cross-section and is clipped off. This is further worsened for misaligned input beams whose optical axis is offset relative to the center axis of the MMI.

When the FWHM of the input beam is more than 14/10 of the width of the MMI only 60% of the light is coupled into the MMI even without input beam misalignment so that an MMI narrower than 10/14 of the FWHM of the input beam is only marginally useful.

The optimum length for the MMI in order to satisfy the above-described MMI functionality depends on a number of factors, such as the effective index of the slab in which the MMI is defined, the slab width and the input beam width in the horizontal direction. Once an optimum MMI length has been determined for a specific design, it can be adjusted for variations of this design by rescaling it proportionally to $L_\pi$. This is particularly effective if the input beam width and the MMI width are both rescaled by the same amount in the new design.

In general, the optimum length also depends on the input beam width, however there are a couple of sweet spots that are found to work well in many instances. MMI lengths close to $L_\pi/2$ are found to work well in most cases and MMI lengths close to $3L_\pi/2$ are found to work well in cases where the input beam width is sufficiently large relative to the MMI width. Due to the periodic nature of the imaging properties of an MMI, the same holds for MMI lengths of $3L_\pi-L_\pi/2$, $3pL_\pi+L_{\pi/2}$ and $3pL_\pi-L_\pi/2$ in the first case and MMI lengths of $3pL_\pi+3L_\pi/2$ in the second case, where p is an integer. In general, MMIs with lengths $3pL_\pi \pm L$ but with otherwise identical dimensions have the same imaging properties.

An MMI with a length $L_\pi/2$ images an input beam originally centered on the center axis of the MMI as three images at the MMI output and images an input beam offset by $\pm W/6$ as two images at the MMI output, where W is the width of the MMI. These rules differ from the previously mentioned general MMI length formulas due to restricted mode excitation and restricted interference, as taught in "Optical Multi-Mode Interference Devices based on Self-Imaging: Principles and Applications". This results in both cases, as well as for intermediate cases where the input beam displacement from the center axis is smaller than W/6 and cases where it is larger than W/6 in substantially overlapping images at the output of the MMI provided the FWHM of the input beam is larger than 2/10 of the MMI width. Thus the previously described MMI properties are obtained with a high level of performance for input beams with a FWHM larger than 2/10 of the MMI width. In this case the scheme deteriorates quickly for an input beam FWHM below 1.5/10 of the width of the MMI. The performance of the device degrades for beams with a FWHM larger than 6/10 of the MMI width due to excessive ripples in the intensity and phase profile at the output of the MMI. In general, MMI lengths between $3pL_\pi+L_\pi/4$ and $3pL_\pi+3L_\pi/4$ as well as between $3pL_\pi-3L_\pi/4$ and $3pL_\pi-L_\pi/4$, where p is an integer including zero, work well with these input beam widths. It is understood that these limits apply for both the definition of $L_\pi$ as $4n_{eff}W^2/(3\lambda_0)$ and the definition of $L_\pi$ as $\pi/(\beta_0-\beta_1)$, since the two are typically close to each other. Claims describing the apparatus as a function of n should be taken as corresponding to both formulas and to the more inclusive limits for MMI lengths, i.e. covering both spans of MMI lengths.

An MMI with a length $3L_\pi/2$ images an input beam as two symmetric images at the output facet of the MMI that are offset from the center axis of the MMI by the same amount as the input beam. An MMI with such a length can also satisfy the initially-described MMI properties provided the input beam FWHM is larger than 3/10 of the MMI width and it works particularly well for beams with a FWHM larger than 4/10 of the MMI width. In general, MMI lengths between $3pL_\pi+3L_\pi/2-L_\pi/4$ and $3pL_\pi+3L_\pi/2+L_\pi/4$, where p is an integer including zero, work well with these input beam widths.

It should be noted that MMIs are normally operated with much thinner beams outside the context of this invention, since it is normally the purpose of MMIs to create distinct beams at the MMI output, for example to implement single mode waveguide splitters or waveguide crossings. Here, the MMIs are operated in a completely different regime.

Figure 13:
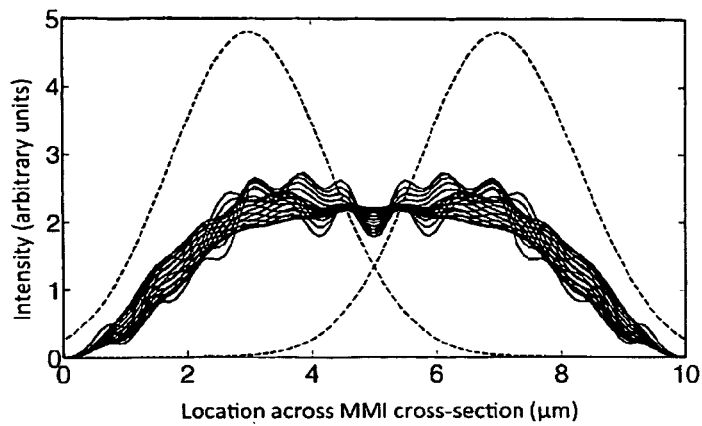
FIG. 13 shows a graphical numerical example of the intensity distribution profile of a multi-mode interferometer assuming a slab effective index of 2, a MMI width of 10 μm, a MMI length of 85 μm and a Gaussian input beam with a FWHM of 2.8 μm.

An example is an MMI with a slab effective index of 2, as would for example be obtained by fabricating the slab out of silicon nitride, an MMI width of 10 µm, an MMI length of 85 µm corresponding substantially to $L_\pi/2$, an input beam with a FWHM of 2.8 µm in the horizontal direction and an operation wavelength of 1.55 µm. The properties of this MMI are shown in FIG. 13.

Another example is an MMI with a slab effective index of 2.8, as would for example be obtained by fabricating the slab out of 220 nm thick silicon surrounded by silicon dioxide, for example by starting with SOI material, an MMI width of 10 µm, an MMI length of 119 µm corresponding substantially to $L_\pi/2$, an input beam with a FWHM of 2.8 µm in the horizontal direction and an operation wavelength of 1.55 µm.

In the previous examples the phase front distortions (the rate at which the phase of light varies along the horizontal direction) at the output of the MMI remain below 1 radian per micron over 80% of the MMI width containing 98% of the optical power even for large input beam misalignments of ±2 µm. For such slowly varying phase front distortions, typical single mode SOI waveguides with a width of 400 nm at the MMI output interface can be connected with small insertion losses resulting from phase front distortion, below 2%. Resulting insertion losses would also lie below 10% for 1 µm wide waveguides at the MMI output, for example with a wider width due to tapering of the waveguides within the waveguide array transition. In some embodiments, the phase front distortion at the output of the MMI remains below 3 radians per micron over a contiguous portion of the output of the MMI covering at least 50% of the MMI width and containing at least 50% of the optical power at the end of the MMI even for large input beam misalignments of ±1 µm.

Another example is an MMI with a slab effective index of 2, as would for example be obtained by fabricating the slab out of silicon nitride, an MMI width of 10 µm, an MMI length of 252 µm corresponding substantially to $3L_\pi/2$, an input beam with a FWHM of 5.3 µm in the horizontal direction and an operation wavelength of 1.55 µm.

Another example is an MMI with a slab effective index of 2.8, an MMI width of 10 µm, an MMI length of 353 µm corresponding substantially to $3L_\pi/2$, an input beam with a FWHM of 5.3 µm in the horizontal direction and an operation wavelength of 1.55 µm.

These examples have been verified to work very well for lateral input beam displacements up to ±2 µm, i.e. larger than the state-of-the-art accuracy of passive, machine vision guided, pick-and-place assembly processes.

If the waist of the input beam is not at the input of the MMI, the formulas given here for the MMI length can be adjusted accordingly. If the waist is prior to the input of the MMI, as if for example obtained when a laser diode chip is the second optical element and the distance between the output facet of the laser diode and the input interface of the primary photonic chip is larger than the waist length of the laser beam, the MMI behaves as if a beam with a substantially identical width at its waist as the actual input beam had propagated through a longer MMI due to the fact that the input beam has already been diffracting prior to entering the MMI. This excess effective MMI length can be calculated as $1 \times (n_{eff}/n_0)$ where $n_{eff}$ is the effective index of the slab out of which the MMI is fabricated and no is the bulk refractive index or effective index of the medium prior to the MMI in which the beam has propagated prior to entering the MMI, depending on whether it is a slab or a bulk material. 1 is the distance between the waist of the beam and the input of the MMI. If several media with indices $n_0, n_1, n_2 \ldots$ and lengths $l_0, l_1, l_2 \ldots$ are located between the input of the MMI and the waist of the beam, the excess effective length can be computed as $l_0 \times (n_{eff}/n_0) + l_1 \times (n_{eff}/n_1) + l_2 \times (n_{eff}/n_2) + \ldots$.

This excess effective length can also be computed when more complex media are located prior to the MMI. One procedure is to calculate the field distribution inside the MMI at the very beginning of the MMI, approximate it by an expanding Gaussian beam, for example by fitting it by minimizing a least sum of square residue, and reverse transform the Gaussian beam, i.e. computationally reverse its direction of propagation by complex conjugating all the field components and multiplying the H-field by minus 1, reverse propagate the reverse transformed Gaussian beam assuming the material prior to the MMI is the same slab out of which the MMI is made, even if this is not physically the case. Where the beam reaches its waist in this simulation, i.e., the virtual focus of the Gaussian beam, is the virtual input of the effective MMI, and the effective length should be taken from that point. Rather than taking a Gaussian approximation of the field within the beginning of the MMI, one can also directly reverse propagate the field assuming the material prior to the MMI to be the same slab, without first applying a Gaussian approximation. There will still be a beam waist where the beam substantially reaches its thinnest cross-section (neglecting speckles in the simulated field), the virtual input of the MMI should be taken from that point and the effective length calculated accordingly. In other words, the MMI and beam behave as if a beam with said virtual focal point had been input in an MMI with said virtual input since the resulting field at the input of the physical MMI is substantially equivalent.

If the input beam is converging rather than diverging when entering the MMI, the effective length of the MMI should be calculated from the point where the beam first reaches its waist within the MMI. In such a case the effective length would be shorter than the physical length rather than being longer as in the previous case.

One possibility is for the MMI to reach all the way to the input interface of the primary photonic chip. This can for example be the case with little penalty if the MMI has a slab thickness such that the vertical beam width of the MMI modes is matched with the vertical width of the input beam. Such a configuration could for example be implemented in embodiments in which the MMI is made out of silicon oxi-nitride, or another material with a refractive index between silicon dioxide and silicon, and in which the light is coupled from the silicon oxi-nitride film or said other material film into silicon waveguides at the end of the MMI, for example with inverse tapers defined in the silicon waveguides. Alternatively, such a configuration could be implemented in embodiments in which the MMI is defined in the top silicon layer of SOI material with a top silicon layer that is sufficiently thick to be sufficiently well directly matched to the vertical dimension of the input beam.

Another possibility is for an additional coupling structure, previously referred to as the MMI input transition, to be interposed between the interface of the primary photonic chip and the main portion of the MMI. This is for example desirable if the MMI is made out of a slab whose thickness is not matched with the vertical width of the input beam. In such a case, the vertical width of the input beam first has to be matched to the slab thickness with the additional coupling structure, the MMI input transition, in order to prevent excessive optical insertion losses. This MMI input transition then plays the role of an optical mode size converter.

For waveguides, an easy to implement mode size converter that converts the mode size in both the vertical and horizontal directions without requiring a vertical tapering of the film thicknesses is an inverse taper in which the waveguide is tapered down to a very small, or even a vanishing cross-section. Since this cross-section can be primarily reduced in the horizontal direction and fully defined by lithography, it can be easy to manufacture. This principle cannot be applied directly to a multi-mode slab, such as the slab out of which the MMI is made, however this technique can be generalized to a slab. The slab first has to be broken down into multiple waveguides at the MMI input. These waveguides can then be individually tapered down and routed to the input interface of the primary photonic chip. The mode of each inversely tapered waveguide is widened in the vertical direction while it approaches the interface of the primary photonic chip. Typically, the modes of the waveguides also strongly overlap at the input interface of the primary photonic chip, so that the super-modes of the waveguide array strongly resemble the modes of a slab with a larger vertical mode dimension then the slab out of which the main section of the MMI is made. This is achieved if the waveguides are close enough to each other at the interface of the primary photonic chip such that the expanded waveguide modes of the tapered down waveguides substantially overlap. The optical structure at the input interface of the primary photonic chip is equivalent to a wide multi-mode waveguide transporting modes with a much larger vertical dimension, since the degrees of freedom of the array of waveguides emulate the behavior of a multi-mode system such as a slab and since the waveguide modes are sufficiently overlapping such that the discrete nature of the waveguides disappears.

It is desirable to taper down the waveguides to dimensions substantially smaller than the largest width for which the waveguides remain single mode (which is the typical width normally chosen for such waveguides), so as to sufficiently expand the waveguide mode in order to obtain mode matching in the vertical direction with the input beam. Typically the width of the tapered down waveguides will be chosen to be less than 70% of the width at which at which the waveguides becomes multimode. In some cases with large vertical mode mismatch such as between a thin top silicon SOI layer and a laser diode, the widths of the waveguides will be chosen to be below 50% or even below 25% of the widths at which the waveguides become multimode.

Typically, these waveguides are strongly or very strongly coupled to each other over the entire distance between the input interface of the primary photonic chip and the onset of the primary MMI section. Typically, they are at least strongly coupled to each other at the input interface of the primary photonic chip in order to emulate a slab mode for the input beam to couple to and at the input of the main section of the MMI in order to have a high overlap with the slab modes of the primary MMI section. For this reason, the waveguide array of the MMI input transition described here contributes to the multi-mode interference effect and has to be taken into account in the effective MMI length with the methods described above. One way to establish an effective index for the waveguide array so as to apply it to the above-mentioned excess effective MMI length formulas is to compute the equi-frequency contours in k-space and to approximate these by circular contours in the vicinity of the center k-vector of the input beam, as taught in "Hybrid Superprism with low insertion losses and suppressed cross-talk", J. Witzens et al., Physical Review E, volume 71, article 026604 (2005). For this reason, the concept of primary MMI section has been introduced to distinguish the central section of the MMI from portions of the MMI input transition and sections of the waveguide array transition at the output of the MMI that contribute to the multi-mode interference effect in addition to the primary MMI section.

In some embodiments, the MMI is defined in a thin SOI top silicon layer with a thickness larger than 75 nm but thinner than 500 nm. In such embodiments, the mode conversion apparatus relying on singulating the MMI slab into a multiplicity of waveguides and in inverse tapering these waveguides is implemented at the input of the MMI, between the input interface of the primary photonic chip and the main section of the MMI, and is an embodiment of the MMI input transition. In some embodiments, each of the inverse tapered waveguides connected to the input side of the MMI and collecting a substantial portion of the input beam are less than 300 nm high, less than 120 nm wide at their narrowest point or at the closest point to the input interface of the primary photonic chip, and adjacent such tapered waveguides are closer than 1 μm to each other at the closest point to the input interface of the primary photonic chip. In some embodiments, this mechanism can be assisted by encapsulating the MMI input transition in an auxiliary waveguide with a refractive index between silicon dioxide and silicon, such as is obtained with silicon nitride, silicon oxi-nitride or SU8.

If a mode size converter is present at the input of the MMI (the MMI input transition), the singulated waveguides in the mode size converter are highly coupled to each other in at least a portion of the mode size converter. At the output of the MMI, in the region where the MMI is singulated into individual waveguides, there also typically exists a region in which these waveguide are highly coupled to each other. Both these regions have to be taken into account when determining the optimum length of the MMI since they contribute to multi-mode interference. One methodology is to calculate an equivalent slab effective index for these regions. Another approach is to estimate the effective length by determining the light profile at the beginning of the main section of the MMI and determining the effective length of the MMI as previously described. The same methodology can be applied to the output of the MMI by solving the converse problem: Light can be sent back in (in simulations) from one of the output waveguides into the MMI, e.g., one of the center waveguides, and propagated into the MMI. The field profile is then recorded in the main section of the MMI shortly after entering the main section, time-inversed and reverse propagated back in the direction of the output waveguides but assuming that the structure remains the slab out of which the MMI is constituted, even if this is not physically the case. The point where the beam reaches is waist is then determined. The distance between this point and the onset of the main section of the MMI is the excess effective MMI length that has to be further added to the length of the main section of the MMI. Prior to reverse propagating the field back into the direction of the output waveguides, the field can also be approximated by the closest matching Gaussian beam as previously described, for example by using a least sum of squares methodology to fit the beam.

In principal up to the entire MMI could be made out of individual but highly coupled waveguides, since together they act equivalently to a slab. This implementation can however be detrimental due to the finite coherence length of waveguides, i.e. due to fabrication dependent random phase offsets accumulated by light propagating through the waveguides. The formulas described in previous paragraphs can still be applied since the definition of n is tied to the beating length of the first two modes. These modes are still defined for the waveguide array in the form of super-modes (coupled waveguide modes delocalized throughout the width of the array). It has also been described how an effective index can be established for the waveguide array by inspecting the equi-frequency contours, so that the formula $L_\pi = 4n_{eff}W^2/(3\lambda_0)$ can also be applied.

The functionality of the MMI is also very robust to angular misalignment of the second optical element, in that it is insensitive to angular variations of the incoming optical input beam to up to several tens of degrees.

An aspect of the second aspect is that the optical path between the input interface of the primary photonic chip and the onset of the main section of the MMI (the input port of the MMI) is necessarily multi-mode in that it does not consist in a unique single mode optical path. In one configuration the input port of the MMI is located directly at the input interface of the primary photonic chip, in which case this is evidently the case. In another implementation an array of highly coupled waveguides is located between the input interface of the primary photonic chip and the input port of the MMI, in which case this is also evidently the case since an array of highly coupled waveguides is functionally equivalent to a slab. In yet another configuration, an array of waveguides routes light from the input interface of the primary photonic chip to the input port of the MMI such that the waveguides constituting said array can be individually locally single mode, independent and not coupled to their nearest neighboring waveguides. This remains however effectively a multi-mode path since in their ensemble, the entire set of waveguides remains multi-mode, since each waveguide contributes an individual degree of freedom. In this case it is important to take into consideration that the waveguides of the array of waveguides do not carry light from different sources or different signals, but all carry light provided from the same unique input beam without additional processing to the input beam between the input interface of the primary photonic chip and the input port of the MMI, such as phase or amplitude modulation between the point were the input beam is split into the several waveguides and the point where the waveguides enter the main section of the MMI. It is obvious that the multi-mode nature of the optical path between the input interface of the primary photonic chip and the input port of the MMI is necessary for the usefulness of this invention. A unique single mode path between these two elements would create a single mode bottleneck equivalent to directly coupling the laser to a unique single mode waveguide. The tolerance to input beam misalignment obtained by exploiting the multi-mode nature of the system would then be lost.

It should also be noted that the waveguides connected to the end of the main section of the MMI or the single mode optical paths connected to the end of the multi-mode section have typically substantially identical spectral content even when the optical input beam is provided by a multi-wavelength source. For example, an MMI can be designed such that the transfer function is substantially insensitive over the entire telecommunications C-band for at least one connected waveguide or connected single mode optical path, in that there is less than 5 dB frequency dependence, or ideally less than 3 dB or even 2 dB frequency dependence. Ideally, the same holds for all the connected waveguides or all the connected single mode optical paths. The same can be achieved for the entire telecommunications L-band or for other wavelength regions of at least 50 nm or ideally at least 100 nm wavelength span located between 400 nm and 10000 nm. This is made possible due to the low wavelength dependence of MMIs that is further increased here in the context of the initially described MMI functionality.

Another aspect of the second aspect is that typically at least one single mode optical path connected to the end of the MMI will carry light that enters the MMI from substantially different positions at the input port of the MMI when comparing several instances of the finished good, depending on how the input beam was aligned at the input interface of the primary photonic chip, when comparing different instances of a nominally identical finished good that suffers from a variation of input beam alignment due to variations in assembly. Indeed, if this were not the case, one of the reasons for interposing the MMI between the interface of the primary photonic chip and the rest of the system would be voided. In this case substantially different positions means that the input beam can be typically shifted by more than one FWHM of the input beam while maintaining a functional finished good, or at least ½ of the FWHM of the input beam while maintaining a functional finished good.

Another aspect of the second aspect is that the horizontal width of the input beam at the input interface of the primary photonic chip is typically large enough such that at least two of the images of the input beam created by the MMI at its output port (the imaging plane at the end of the MMI located where the optical paths picking up the light become substantially independent or located at the end of the main section of the MMI) are separated by less than 50% of the smaller FWHM of the two images as measured by the distance between the points where the intensity distribution of the images reaches ½ of their maximum. This results in output images that are substantially overlapping. Independent images can be identified by the fact that if the input beam were thinner, images would be spatially separated and clearly distinct as is the case in a conventional MMI.

Another aspect of the second aspect is that in some embodiments, the position of the input beam can be shifted by more than 70% of its FWHM in either horizontal directions along the interface of the primary chip while suffering from very little additional insertion loss penalty, wherein said additional insertion loss penalty is smaller than 1 dB, 2 dB, 3 dB or 5 dB. This is for example the case in the two embodiments described above of an MMI with a slab effective index of 2 and the two embodiments described above of an MMI with a slab effective index of 2.8.

Another aspect of the second aspect of the invention is that the waveguides connected to the output of the MMI are typically part of a single mode optical path, even though the optics at the input of the MMI, between the input interface of the primary photonic chip and the input port of the MMI, are effectively multi-mode. The single mode optical paths connected to the output of the MMI taken together are typically not functionally equivalent to a single multi-mode path in that they are typically not recombined in a single mode or multi-mode guiding apparatus or in a free-space optical beam without at least an adjustable phase delay applied to at least one of the single mode optical paths, since this is required to compensate for the phase front distortion at the output port of the MMI.

Another aspect of the second aspect is that the light intensity distribution at the output port of the MMI can remain above 50% of the maximum of the intensity distribution over a topologically connected region covering at least 50% of the total width of the MMI. In some instances, the effect might be less ideal so that the intensity distribution remains above 35% of the maximum of the intensity region over a topologically connected region of the MMI width covering at least 35% of the width. In both cases and in intermediate cases where these numbers are between 35% and 50%, these regions are typically centered on the center axis of the MMI. If the MMI cross-section at the output port is that of a single multi-mode waveguide, the meaning of topologically connected is obvious. If the MMI cross-section is an array of single mode waveguides, this refers to the mode intensity of adjacent waveguides. If the MMI cross-section is an array of multi-mode waveguides each connected to single mode optical paths or a combination of multi-mode and single mode waveguides each connected to single mode optical paths, this refers to the intensity of the light profile that will eventually be coupled to the single mode of the closest single mode portion of the single mode optical paths. This intensity of the light profiles can for example be determined in simulations by taking an inner product of the waveguide light profiles with the light profiles resulting from reverse propagating light through the single mode optical paths (starting from the output ports of the primary photonic chip) and time inversing said light profile. Mode filtering by taking an inner product is a technique well known to one skilled in the art and is also taught in "Integrated Photonics Fundamentals" by Gines Lifante, John Wiley and Sons Ltd., ISBN 0-470-84868-5, Edition 2003, Chapter 4, Section 4.1.1. "Modal Orthogonality and Normalization".

A distinguishing aspect of the second aspect is that typically at least two independent single mode optical paths pick up light at the end of the MMI such that each of these at least two single mode optical paths carry a substantial portion of the total optical power of the optical input beam such that this substantial portion of the total optical power is at least 20% of the total power from the optical input beam carried by single mode optical paths on the primary photonic chip. Since phase front distortion limits the width of the waveguides connected to the end of the MMI, and since it is desirable for these waveguides to cover most of the width of the MMI, or at least the portion of the width corresponding to a flattop beam profile, there can be more than two single mode optical paths connected to the end of the MMI. Typically there can be from 2 to 30 single mode optical paths connected to the end of the MMI. Amongst these single mode optical paths, there are at least 2 to 30 single mode optical paths (a subset of the 2 to 30 single mode optical paths connected to the end of the MMI) that carry at least 20% of the maximum power of the input beam carried by any of the single mode optical paths.

The function of the MMI section consists in compensating for input beam misalignment by providing a stabilized intensity distribution at the output of the MMI irrespectively of allowable input beam misalignment in a way such that the induced spatial phase front distortion at the output of the MMI is slowly varying. This results in high insertion of light into the single mode optical paths at the output of the MMI irrespectively of the allowable misalignment of the input optical beam to a level that would not be achieved in the absence of the MMI section. In some embodiments the intensity at the output port of the MMI is at least 50% of the maximum intensity at the output port of the MMI over at least the 50% of the MMI width closest to the center of the MMI width, in a way such that the maximum phase variation at the output of the MMI is at most 1 radian per micron over said 50% of the MMI width for misalignments of the input beam lying within ±2/10 of the MMI width. This allows lateral (horizontal) displacement of the input beam relative to its nominal position (targeted position during assembly) of ±2/10 of the MMI width while inducing negligible excess insertion losses. In some embodiments the intensity at the output port of the MMI is at least 35% of the maximum intensity at the output port of the MMI over at least the 35% of the MMI width closest to the center of the MMI width, in a way such that the maximum phase variation at the output of the MMI is at most 3 radian per micron over said 35% of the MMI width for misalignments of the input beam lying within ±1/10 of the MMI width.

This allows lateral (horizontal) displacement of the input beam relative to its nominal position (targeted position during assembly) of ±1/10 of the MMI width while inducing acceptable excess insertion losses.

In some embodiments, there is a least one single mode optical path connected to the output of the MMI such that at least 20% of the optical power picked up by said single mode optical path corresponds to one image of the MMI input while at least 20% of the optical power picked up by said single mode optical path corresponds to another image of the MMI input. Individual images can be determined by the fact that if the input beam was narrower but had the same optical axis, these images would be non-overlapping at the output port of the MMI and well defined images of the MMI input. Since typically there is a relatively low number of images contributing in some cases, such as when the MMI has a length of $L_\pi/2$, there are typically single mode optical paths coupled to the end of the MMI such that light picked up from said single mode optical paths is at least 30% from one image and 30% from another image. In some cases, such as when the input beam is offset by W/6 and the length of the MMI is $L_\pi/2$, these numbers can even be respectively at least 40% from one image and at least 40% from another image.

In some embodiments, all or a subset of the single mode optical paths connected to the output of the MMI are eventually recombined on or outside of the primary photonic chip. The system recombining the light comprises at least a phase shifter to compensate for the phase variations of the light in the individual single mode optical paths induced by variations of the alignment of the input beam at the input interference of the primary photonic chip.

In some embodiments, this recombination of the light from several single mode optical paths also allows separating the light by wavelengths by steering it to different optical waveguides according to the wavelength. This can be achieved for example with an arrayed waveguide grating after correcting the phase variations in the single mode optical paths. This can also be achieved with an Echelle grating by projecting the light from the single mode optical paths onto the Echelle grating after correcting for the phase variations in the single mode optical paths. This is particularly relevant if the second optical element is a multi-wavelength laser such as a comb laser. In such embodiments the MMI at the input interface of the primary photonic chip plays a dual role of facilitating coupling of light at the input interface for the primary photonic chip and of an input power splitter for the arrayed waveguide grating. The single mode optical paths can then be connected to the output stage of an arrayed waveguide grating such as a star coupler.

In some embodiments this recombination of the light from several single mode optical paths corresponds to the output directional coupler, output Y-junction, 2 to 1 MMI, 2 to 2 MMI or other output waveguide combiner or coupler of a Mach-Zehnder Interferometer (the output stage of the Mach-Zehnder interferometer). In this embodiment, the Mach-Zehnder Interferometer can also be used to either steer, switch or modulate the light according to a data stream, including a control signal or other types of signal. In such embodiments the MMI at the input interface of the primary photonic chip plays a dual role of facilitating coupling of light at the input interface for the primary photonic chip and of an input power splitter for the Mach-Zehdner Interferometer.

In some embodiments this recombination of the light from two single mode optical paths corresponds to the output directional coupler, output Y-junction, 2 to 1 MMI, 2 to 2 MMI or other output waveguide combiner or coupler of a Mach-Zehnder Interferometer. In such embodiments, two other single mode optical paths singulated at the output of the MMI are recombined through another directional coupler, output Y-junction, 2 to 1 MMI, 2 to 2 MMI or other output waveguide combiner or coupler of a Mach-Zehnder Interferometer. The outputs of these two Mach-Zehnder interferometers are further combined by a third waveguide combiner or coupler. Such embodiments can serve to implement a modulator for a QPSK encoding scheme, or can serve to recombine the light from four single mode optical paths connected to the MMI output into a unique single mode optical path or can serve to recombine the light from four single mode optical paths connected to the MMI output into several downstream single mode optical paths such that the power or phase carried by said downstream single mode optical paths is further homogenized.

For both the first and the second aspect, a second optical element can be attached to the primary photonic chip such that the second optical element sends several beams towards the primary photonic chip. This can for example be the case if the second optical element is a laser diode chip with several laser strips. In this case, there can be several primary photonic chip interfaces as described in the first and second aspect such that each of these primary photonic chip interfaces couple in one of the multiple optical beams from the second optical element utilizing the apparatus described in the first or second aspect of the invention.

A third aspect addresses the attachment of the second optical element onto the primary photonic chip in a manner that is tolerant to high particle count, allows efficient heat sinking of the second optical element while maintaining high alignment accuracy between the second optical element and the primary photonic chip in the vertical direction. This apparatus is particularly relevant when the second optical element is a semiconductor laser diode that needs to be provided with an efficient heat-sinking mechanism. The third aspect is further relevant when the primary photonic chip is fabricated out of SOI material.

The apparatus taught in "Hybrid Integration of InP Lasers with SOI Waveguides Using Thermocompression Bonding" allows attaching a semiconductor laser diode to a primary photonic chip with high vertical alignment accuracy. In this apparatus, the primary photonic chip is partially etched down to provide an area on which the laser can be attached while vertically aligning the laser beam with the primary photonic chip. The etch also etches through a waveguide on the primary photonic chip, thus creating an input interface of the primary photonic chip to which the laser beam can be optically coupled. The etch depth is chosen so that when the laser diode is attached face down (with the laser strip down) onto the primary photonic chip, the laser beam is at the same height than the etched through waveguide. The laser can be attached by methods such as thermo-compressive bonding or eutectic bonding that both allow thermal contacting of the laser chip as well as precise vertical positioning, since these bonding methods rely on very thin metal layers (a few 100 nm).

This apparatus is however not tolerant to dust, since dust interposed between the laser and the primary photonic chip will compromise its vertical positioning.

In the apparatus taught in "Hybrid Integration of InP Lasers with SOI Waveguides Using Thermocompression Bonding" the etch into the primary photonic chip etches partially through the buried oxide layer (BOX) of the SOI material but does not reach the bulk silicon handle of the SOI material. Thus the laser is provided with poor heat-sinking, since heat has to escape through the BOX oxide layer and oxide is a much less conductive material than silicon.

A solution would be to etch deeper into the primary photonic chip to reach the silicon handle prior to attaching the laser. However in a photonic chip the BOX thickness is typically 1.5 to 3 μm, so that this would result in the laser beam being much lower than the waveguide and would result in no light being coupled from the laser diode into the waveguide on the primary photonic chip. The same holds for other categories of second optical elements if the waveguide transporting light on the second optical element is close to the surface of the second optical element.

A solution to this would be to use a bonding method that allows a much larger distance between the etched surface of the primary photonic chip and the surface of the laser chip or other $2^{nd}$ optical element. Such a method can for example be bump bonding with controlled collapse of the laser chip or other $2^{nd}$ optical element onto the primary photonic chip. The difficulty with this solution results in the fact that bump bonding is not very accurate in the vertical direction on the scale of high index contrast integrated photonics so that this would result in poor and highly varying coupling from the second optical element into the primary photonic chip.

In order to maintain vertical positioning accuracy, the etch reaching down to the silicon handle is not applied to the entire region below the semiconductor laser, but to a substantial portion of it not including all of it. The remaining portion remains as features that mechanically stop the collapse of the laser diode chip onto the primary photonic chip. These features are referred to as spacers.

The top of the spacers can be completely un-etched and at the same level as the rest of the un-etched surface of the primary photonic chip. Their height can also be adjusted by partial etching not reaching the silicon handle (bulk silicon) in order to adjust the height of the semiconductor laser beam or other optical input beam relative to the optical devices on the primary photonic chip. It is desirable for such an etch to stop between two different thin films of different nature or composition, so that selective etching or end-point detection can be used to precisely control the etch stop and thus the vertical positioning of the laser beam or other input beam from another category of second optical element. This etch stop can for example occur between a back-end dielectric layer and the top SOI silicon film of the SOI material, the top silicon film of the SOI material and the buried oxide of the SOI material (BOX oxide), two different back-end dielectric layers of different composition or a back-end dielectric and a metallic layer (where either one can be the etched or respectively the remaining layer).

An additional layer can also be deposited onto the spacers in order to adjust the height of the second optical element and of the input beam. This additional layer can be deposited on a partially etched spacer or on an un-etched spacer. This additional layer can also be deposited prior or after of any of the partial etches defining the spacers.

Bump bonding or another bonding method with a different adhesive layer or adhesive material can be used to attach the laser diode chip or other $2^{nd}$ optical element to the photonic chip with attachment occurring between regions of the primary photonic chip were an etch reaches the silicon handle and the $2^{nd}$ optical element Covalent, anodic, eutectic or other bonding types can also be applied to attach the $2^{nd}$ optical element to the photonic chip with attachment occurring between the top of the spacers and the $2^{nd}$ optical element.

Such an apparatus can be assembled with a high tolerance to dust, since dust is likely to be located in areas not corresponding to the spacers and thus is likely not to impact the vertical alignment of the laser chip.

Such an apparatus also allows electrical contacting of the laser chip if adhesion is made via bump bonding or with another material allowing electrical connectivity such as another at least partially metallic material. In order to achieve electrical contacting, it is typically necessary to first define metal traces on the silicon handle areas exposed by the etch below the laser die or other $2^{nd}$ optical element These traces can then be further contacted to bring the electrical current on or off these traces. This can for example occur by wire bonding these traces to other areas of the primary photonic chip, by wire bonding these traces to another electrical element or by bump bonding these traces to another electrical element.

Said metal traces at the bottom of the etch used to expose the wafer handle can be selective to the bottom of the etch in that they are not present at the top of the spacers where the spacers are in mechanical contact with the second optical element, or said metal traces can also be present at the top of the spacers where the spacers are in mechanical contact with the second optical element in which case their thickness can be used to further adjust the relative vertical positioning of the second optical element relative to the primary photonic chip.

Such apparatus also allows vastly improved heat sinking since silicon has a thermal conductivity that is two orders of magnitude larger than silicon dioxide and bump bonds have a thermal conductivity that is one to two orders of magnitude larger than silicon dioxide.

During bump bonding, as an optional step the second optical element can be compressed onto the primary photonic chip to ensure that the spacers are in mechanical contact with the second optical element.

In order to make the assembly process robust to dust, it is desirable for the spacers to cover a low surface area below the laser chip.

In order to guaranty a good heat sinking, it is desirable to implement a large bump bond surface area coverage in the etched areas below the laser chip, or to implement a large area coverage of another thermally conductive adhesive or filling material. Bump bonds can take the form of actual bumps or larger metal features such as lines, large squares or other shapes.

In some embodiments, the surface area coverage of spacers below the laser chip is less then 25%.

In some embodiments, the surface area coverage of bump bonds or other adhesive material below the laser chip is more than 25%.

The optical input beam can be directly coupled to a waveguide array as in the first aspect of the invention.

The optical input beam can also be coupled to a waveguide array via an MMI section as in the second aspect of the invention.

The laser beam can be directly butt-coupled to a single mode optical path. In some embodiments, this single mode optical path comprises a tapered or inverse tapered waveguide at the input interface of the primary photonic chip.

In some embodiments, the primary photonic chip is made out of silicon on sapphire material, and spacers are defined on the primary photonic chip below the second optical element. The other aspects of the third aspect of the invention can also be implemented in this material system.

FIG. 1: A 3D sketch of a second optical element 2 butt-coupled to a primary photonic chip 1 such that an optical beam called the optical input beam 10 is coupled from a photonic device 3 of the second optical element to a coupling apparatus 4 of the primary photonic chip. The photonic device 3 can for example be the laser strip of a semiconductor laser diode or a waveguide. The coupling apparatus 4 is described as the first and second aspect of the invention and can for example be a strongly coupled waveguide array or a multi-mode interferometer. The coupling apparatus is cut at the input interface 5 of the primary photonic chip. One of the functions of the coupling apparatus 4 is to compensate for lateral misalignment 6 along the horizontal direction of the input interface of the primary photonic chip. The vertical or y-direction 7 is the direction perpendicular to the surface of the primary photonic chip.

Figure 2:
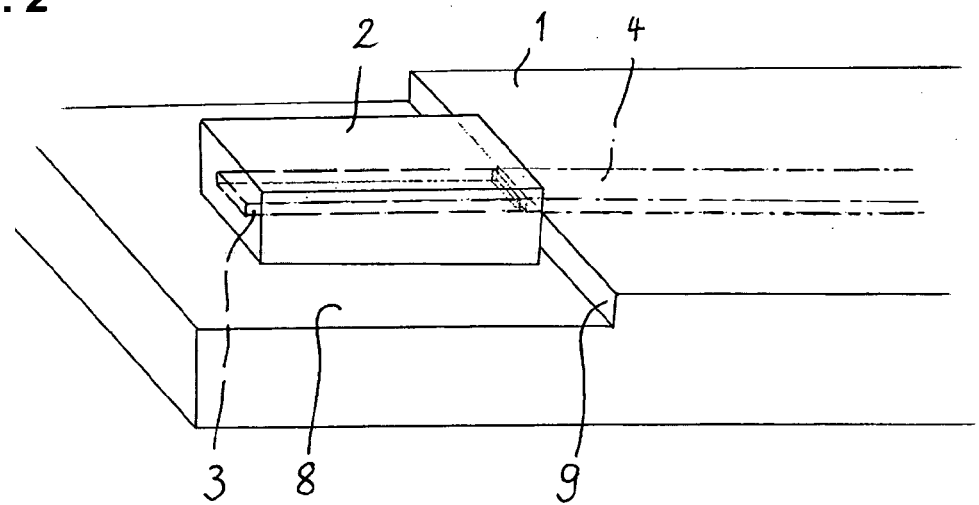
FIG. 2 show a partial perspective side view of an etched area of the primary photonic chip to which the second optical element can be attached while vertically aligning the optical input beam with the coupling apparatus.

FIG. 2: A partial etch of the primary photonic chip creates an etched area 8 on which the second optical element 2 can be attached while vertically aligning the optical input beam with the coupling apparatus 4. The etch also creates an edge 9 on which the input interface of the primary photonic chip is located. The second optical element 2 is typically flipped onto the primary photonic chip 1 prior to attachment, such that the top surface of the second optical element ends up in immediate proximity of the top surface of the primary photonic chip, since the photonic device 3 is close to or on the top surface of the second optical element (by definition of the top surface of the second optical element).

Figure 3:
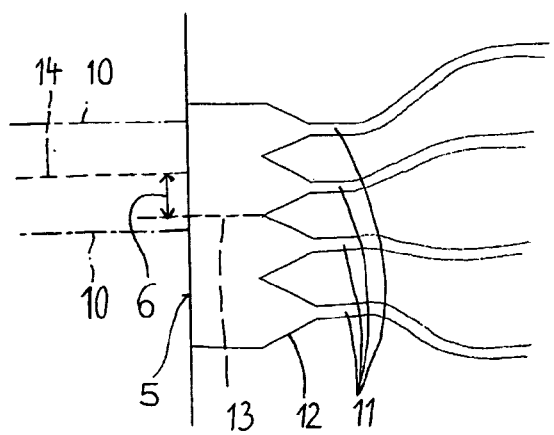
FIG. 3 shows a schematic plan view of an optical input beam coupled to a waveguide array that is coupled at an input interface of the primary photonic chip.

FIG. 3: An optical input beam 10 is coupled to a waveguide array 11 that is strongly coupled at the input interface 5 of the primary photonic chip. The width of waveguides is increased at the interface with the help of tapers 12. A lateral displacement 6 can be the offset between the center axis 13 of the input interface and the optical axis 14 of the input beam, or the lateral displacement between the nominal position of the input beam and the actual position of the input beam defined as the target during assembly (that does not necessarily need to coincide with the center axis of the input interface, even though this is typically the case).

Figure 4:
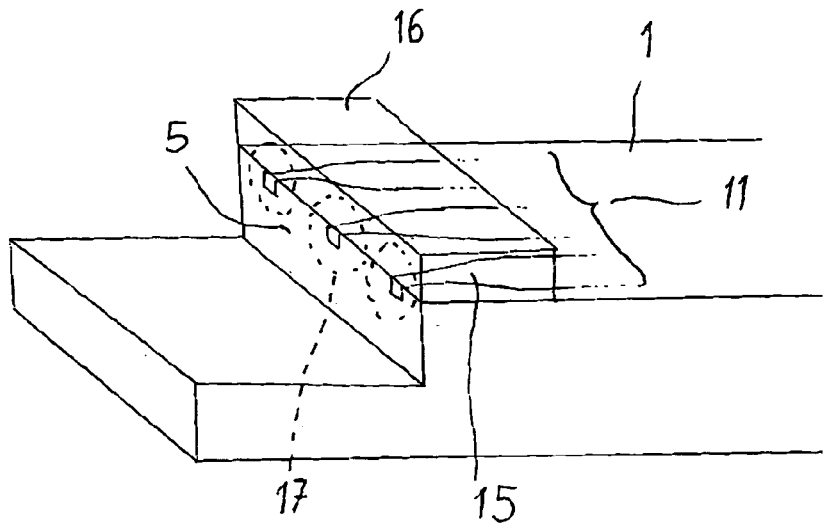
FIG. 4 shows a perspective side view of waveguides of a waveguide array reduced in size with inverse tapers such that their width is substantially smaller than the maximum single mode width at the interface of the primary photonic chip.

FIG. 4: Waveguides of a waveguide array 11 are reduced in size with inverse tapers 15 such that their width is substantially smaller than the maximum single mode width at the interface 5 of the primary photonic chip. Inverse tapers can be fully or partially embedded in a material 16 whose refractive index is smaller than the refractive index of the core material of the inverse tapers but larger than the material(s) surrounding 16. The waveguide modes 17 are expanded in both the horizontal and vertical directions due to the inverse tapers. Waveguides are typically placed in such a way at the interface 5 of the primary photonic chip such that their modes substantially overlap.

FIG. 5: The angles of the waveguides 19 constituting the waveguide array (the non-hashed regions of the primary photonic chip) are routed to the interface 5 of the primary photonic chip in such a way that the direction of the waveguides is not orthogonal to the direction of the interface. In particular, the angle 20 between the direction of the interface 5 and the normal to the waveguide direction is taken to be equal to the angle 21 between the ray 18 inside the waveguide and the normal to the waveguide direction. The rays 18 and 22 are taken such that the waveguide mode can be approximated well by field Fourier components corresponding to rays 18 and 22.

Figure 6:
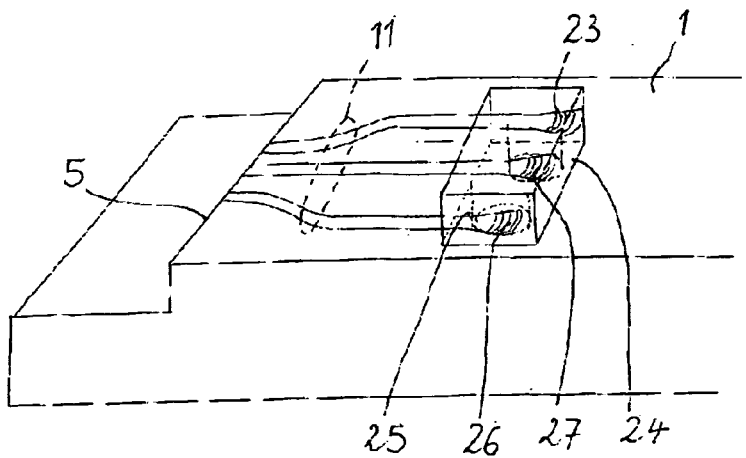
FIG. 6 shows a perspective side view of the waveguides from a waveguide array routed to output ports of the primary photonic chip.

FIG. 6: Waveguides from the waveguide array 11 are routed to output ports 23 of the primary photonic chip 1 that take the form of grating couplers in this figure. Adjacent output ports 26 and 27 are coupled to a third optical element 24, that here takes the form of a fiber array with the footprints of the fibers 25 represented with dashed lines.

Figure 7:
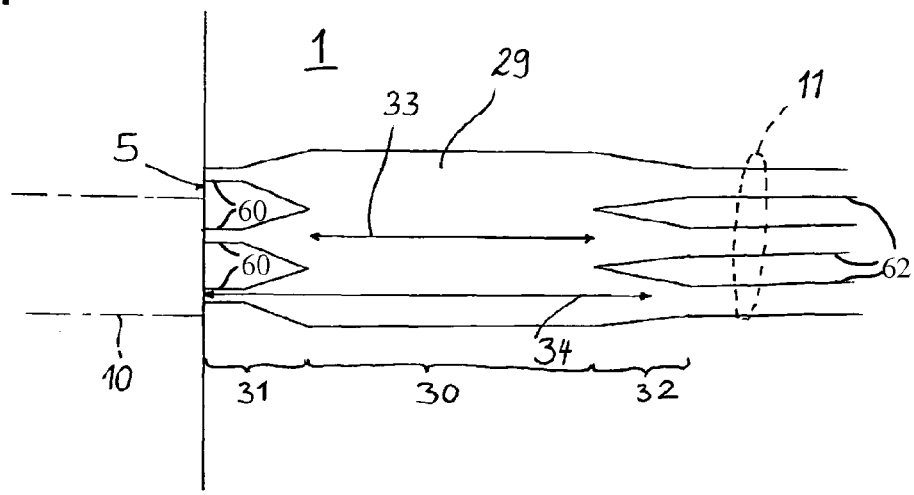
FIG. 7 shows a schematic plan view of an input beam coupled to a multi-mode interferometer located on a primary photonic chip 1.

FIG. 7: The input beam 10 is coupled to a multi-mode interferometer 29 (MMI) located on the primary photonic chip 1. An MMI input transition 31 allows matching of the vertical profile of the optical input beam 10 and the vertical profile of the MMI modes. After a main section of the MMI 30 a waveguide array transition 32 allows coupling of the light into a waveguide array 11. Here the length of the main section of the MMI 33 is slightly shorter than the effective MMI length 34 due to the fact that waveguides 60, 62 are coupled to each other on either side of the MMI thus effectively adding multi-mode sections on either side of the main section of the MMI. Here the waveguide array transition 32 takes the form of waveguide tapers while the MMI input transition 31 takes the form of inverse tapers. Waveguides 60 in the MMI input transition 31, if said input transition is based on waveguides, are typically strongly coupled to each other at least close to the main section of the MMI and at the interface 5 of the primary photonic chip, and can be strongly coupled to each over the entire length of the transition 31. The waveguides 60 at the interface of the primary photonic chip are typically tapered down to dimensions well below the maximum dimension allowing single mode waveguiding and are typically close enough to each other for the waveguide modes to significantly overlap.

Figure 8:
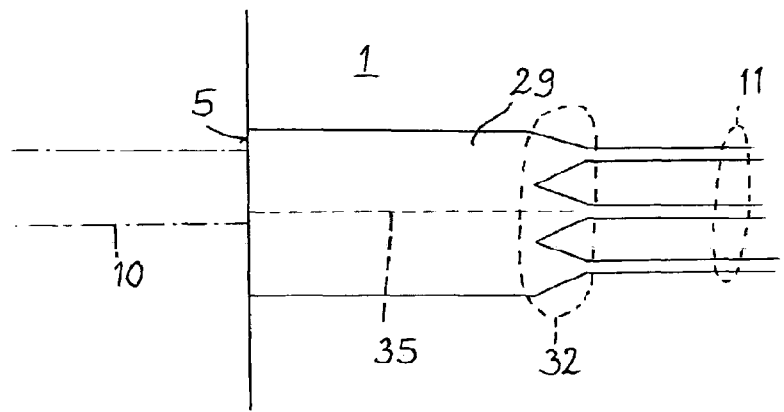
FIG. 8 shows another schematic plan view of the input beam and multi-mode interferometer of FIG. 7, in which a main section of the multi-mode interferometer reaches all the way to an interface of the primary photonic chip.

FIG. 8: A similar apparatus to the one described by FIG. 7, but in which the main section of the MMI reaches all the way to the interface 5 of the primary photonic chip. This is a typical configuration when the thickness of the thin film out of which the MMI 29 is made is already well matched to the vertical dimension of the input beam 10. This is for example the case for an MMI defined in the top silicon layer of SOI material with a thick top silicon layer thicker than 500 nm. In such a layer single mode waveguides, such as could for example be part of the waveguide array 11, can still be defined via a shallow etch into the top silicon layer of the SOI material, said shallow etch typically reaching down less than 50% or even less than 25% or 10% of the silicon layer thickness. In such a case, regular tapers are adequate for the waveguide array transition 32. The figure also shows the center axis 35 of the MMI.

Figure 9:
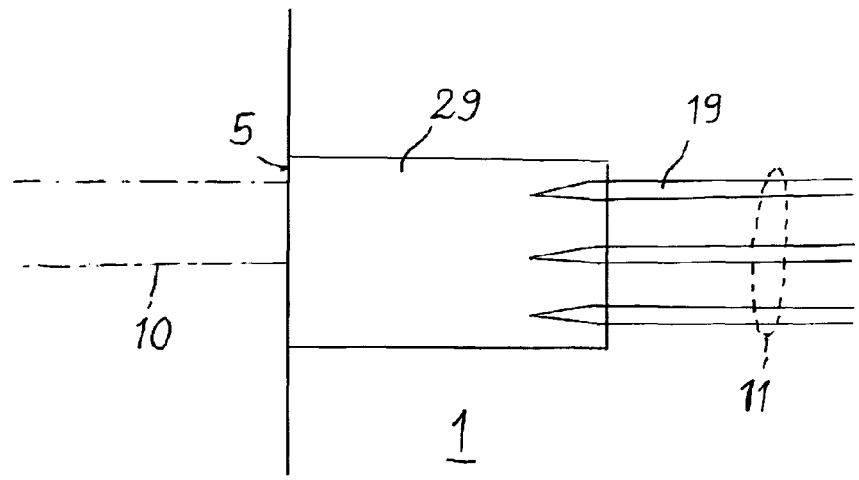
FIG. 9 shows a schematic plan view of an optical input beam coupled to a multi-mode interferometer made out of a different material than the waveguides constituting the waveguide array.

FIG. 9: The optical input beam 10 is coupled to an MMI 29 made out of a different material than the waveguides 19 constituting the waveguide array 11. For example, the core of the MMI 29 can be made out of a material with a lower refractive index than the core of the waveguides 19. This allows for example the slab out of which the MMI 29 is made to remain single mode in the vertical direction (i.e. all the modes have a single lobe in the vertical direction) even when this would not be the case for a similarly thick slab made out of the waveguide material. This also allows making the MMI 29 thick enough to be matched to the input beam in the vertical direction, while this would not be the case had it been directly made out of the waveguide material while maintaining single mode behavior in the vertical direction. Typically, the waveguides 19 can be made out of the top silicon layer of SOI material with a thin top silicon layer (below 500 nm) while the MMI 29 can be made out of a different material such as silicon nitride, silicon oxi-nitride or an organic material such as SU8 with a thickness larger than 500 nm. The waveguides 19 are inverse tapered in order to allow vertical matching of the waveguide modes with the modes of the main section of the MMI. Typically the inverse tapers are at least partially embedded in the material out of which the main section of the MMI is made.

Figure 10:
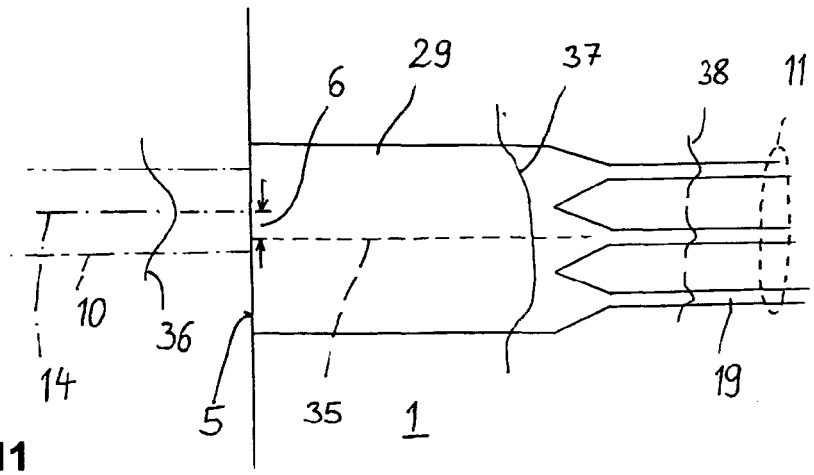
FIG. 10 shows another schematic plan view of the input beam and multi-mode interferometer of FIG. 8, with the input beam misaligned by a horizontal offset.

FIG. 10: This is the same figure as FIG. 8 further illustrating the functionality of the MMI. The input beam 10 is misaligned by a horizontal offset 6. Even though the intensity profile 36 of the input beam is off-center, it is converted into an intensity profile 37 at the end of the MMI that is substantially flattop and substantially recentered on the axis 35 of the MMI 29. The intensity profile 37 can then be coupled to waveguides 19 constituting the waveguide array 11 in such a way that the power coupled to each of the waveguides is substantially equal, or is high enough such that the functionality intended by the downstream optical system to which the waveguides 19 are connected can be fulfilled (i.e. the optical path is functional). The intensity profiles 38 of the waveguides 19 are also shown. The intensity profiles are shown by a curve such that a deviation to the right of the picture represents a higher intensity.

Figure 11:
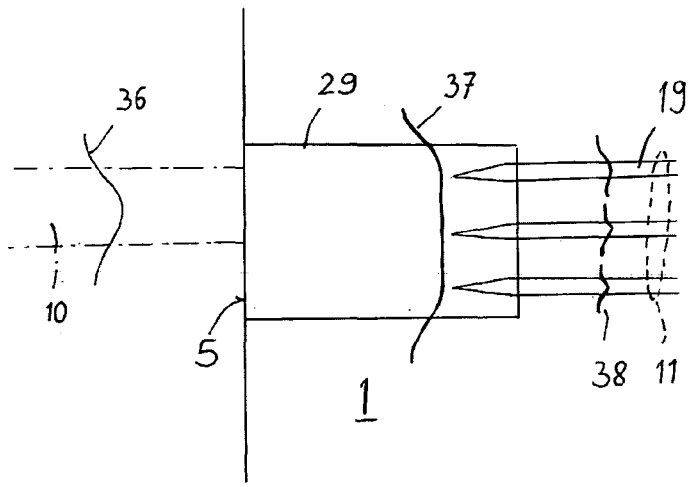
FIG. 11 shows another schematic plan view of the optical input beam and multi-mode interferometer of FIG. 9, with the input beam misaligned by a horizontal offset.

FIG. 11: This is the same figure as FIG. 9 further illustrating the functionality of the MMI. The input beam 10 is misaligned by an offset 6. Even though the intensity profile 36 of the input beam is off-center, it is converted into an intensity profile 37 at the end of the MMI that is substantially flattop and substantially recentered on the axis 35 of the MMI 29. The intensity profile 37 can then be coupled to waveguides 19 constituting the waveguide array 11 in such a way that the power coupled to each of the waveguides is substantially equal, or is high enough such that the functionality intended by the downstream optical system to which the waveguides 19 are connected can be fulfilled (i.e. the optical path is functional). The intensity profiles 38 of the waveguides 19 are also shown. The intensity profiles are shown by a curve such that a deviation to the right of the picture represents a higher intensity.

Figure 12:
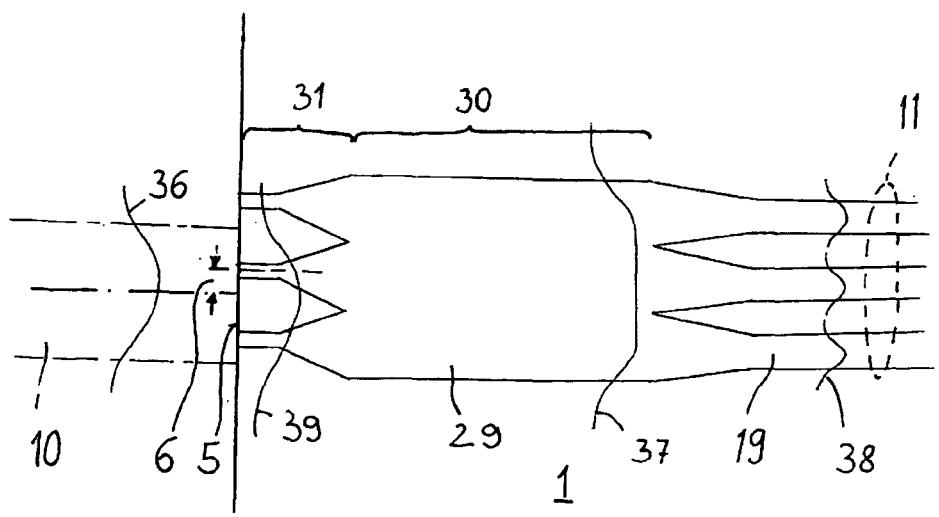
FIG. 12 shows another schematic plan view of the input beam and multi-mode interferometer of FIG. 7, with the input beam misaligned by a horizontal offset.

FIG. 12: This is the same figure as FIG. 7 further illustrating the functionality of the MMI. The input beam 10 is misaligned by an offset 6. Even though the intensity profile 36 of the input beam is off-center, it is converted into an intensity profile 37 at the end of the MMI that is substantially flattop and substantially recentered on the axis 35 of the MMI 29. The intensity profile 37 can then be coupled to waveguides 19 constituting the waveguide array 11 in such a way that the power coupled to each of the waveguides is substantially equal, or is high enough such that the functionality intended by the downstream optical system to which the waveguides 19 are connected can be fulfilled (i.e. the optical path is functional). The intensity profiles 38 of the waveguides 19 are also shown. The intensity profiles are shown by a curve such that a deviation to the right of the picture represents a higher intensity.

In the beginning of the MMI input transition 31, close to the input interface 5 of the primary photonic chip 1, the light has an intensity profile 39 that is closely matched to the intensity profile 36 even though in this case the input transition 31 is constituted out of several single mode waveguides close to the input transition of the primary photonic chip and not by a single slab. This is due to the combination of highly overlapping waveguide modes at the input interface, such that the resulting superposition of modes can mimic the intensity profile 36 of the input beam 10, and due to the fact that the several degrees of freedom provided by the several single mode waveguides provide the degrees of freedom to match the profile 36 even when it varies due to a displacement 6. Thus, the array of waveguides at the MMI input transition is equivalent to a wide multi-mode waveguide, but allows matching of the modes to the input beam in the vertical direction even though the thin film out of which the waveguide cores are made is much thinner than said vertical dimension. While the waveguides broaden in the MMI input transition 31, the optical fields are progressively pulled back into the waveguides in the vertical direction in the sense that the mode profiles become thinner in the vertical direction. At the end of the MMI input transition 31 the waveguides are also typically strongly coupled, which can be seen in FIG. 12 based on the fact that the width of the waveguide cladding regions is reduced until the waveguide cores merge. It is possible that in an intermediate portion of the MMI input transition 31, located between the input interface of the primary photonic chip 5 and the onset of the main section of the MMI 30, the waveguide are not strongly coupled to each other, even though they are typically strongly coupled over the entire length of 31. The input transition of the MMI remains equivalent to a multi-mode structure in both cases, since the several degrees of freedom of the multi-mode structure are still accounted for by the several waveguides and the waveguides are recombined into a multi-mode section 30 without additional processing such as phase or amplitude modulation. The input transition of the MMI is also equivalent to a multi-mode structure since there is no spatial filtering in the horizontal direction of the light that gets coupled into the input transition of the MMI, in that the field intensity distribution 39 at the beginning of the input transition is substantially identical to the field intensity distribution 36 of the optical input beam, and in that the optical power of the intensity distribution 39 gets substantially entirely coupled to the downstream multi-mode optical element given by the main section of the MMI 30. Furthermore the waveguides 19 connected to the end of the MMI 29 all have substantially the same spectral content.

FIG. 13: Numerical example for an MMI assuming a slab effective index of 2, an MMI width of 10 µm, an MMI length of 85 µm and a Gaussian input beam with a FWHM of 2.8 µm. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments. It can be seen that the intensity profile at the output of the MMI has substantially the same shape in all cases, is substantially flattop compared to the input Gaussian profile, and is recentered on the center axis of the MMI (at x=5 µm on the x-axis).

Figure 14:
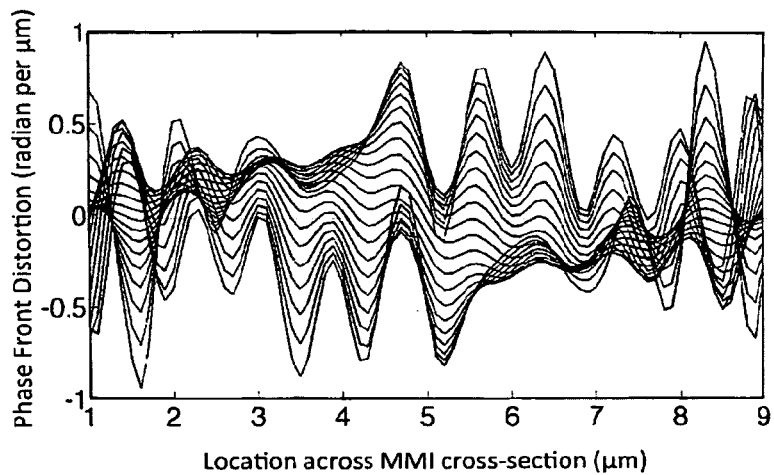
FIG. 14 shows a graphical numerical example of the spatial phase front distortion of the multi-mode interferometer assuming a slab effective index of 2, a MMI width of 10 µm, a MMI length of 85 µm and a Gaussian input beam with a FWHM of 2.8 µm.

FIG. 14: Numerical example for an MMI assuming a slab effective index of 2, an MMI width of 10 µm, an MMI length of 85 µm and a Gaussian input beam with a FWHM of 2.8 µm. The curves show the spatial phase front distortion in radian per micron at the output of the MMI for all intermediate cases of misalignments between ±2 µm, in 200 nm increments. It can be seen that the spatial phase front distortion remains below 1 radian per micron, so that light can be easily picked up by waveguides with horizontal dimensions up into the micron range. Phase front distortions are larger in the extreme left and right positions within 1 micron of the edge of the MMI and are not shown here since the intensity in these regions is so low that they can be neglected without incurring substantial insertion losses (they correspond to approximately 2% of the total power). The penalty due to phase front distortion can be estimated assuming a constant waveguide mode intensity profile as $$abs(1/i\eta w(1-e^{i\eta w}))^2$$

where w is the waveguide width and η is the maximum spatial phase front distortion across the MMI cross-section in radian per distance. Even for relatively large, 2 µm wide waveguides, this corresponds to less than 30% phase front distortion induced insertion penalty and for waveguide widths below 1 µm it is negligible. Due to the robustness relative to waveguide width it is possible to widen the waveguides coupled to the output of the MMI at the edges of the MMI in order to compensate for the decaying intensity profile on the edges. For example, one could place 4 waveguides of approximately 1 µm width at the output port of the MZI centered at approximately 3.5 µm, 4.5 µm, 5.5 µm and 6.5 µm on the x-scale shown in FIGS. 13 and 14, and 2 waveguides of 2 µm width centered on x=2 µm and x=8 µm. It should be noted however that even though there is high, homogeneous and predictable optical power coupling to each of the waveguides, the waveguide to waveguide phase difference is substantial, not predictable, and up to 1 radian for waveguides spaced by 1 micron (center to center) at the output port of the MMI in this example. Hence, it is typically required to add a phase tuning element to at least a subset of the waveguides or single mode optical paths before being able to recombine them.

Figure 15:
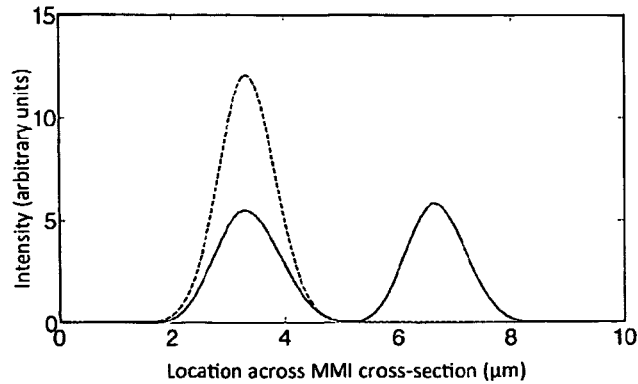
FIG. 15 shows a graphical numerical example of the intensity distribution profile of a multi-mode interferometer assuming a slab effective index of 2, a MMI width of 10 µm, a MMI length of 85 µm and a Gaussian input beam with a FWHM of 1.2 µm. The dashed line shows the Gaussian input beam intensity profile for a displacement of −W/6, where W is the MMI width.
Figure 16:
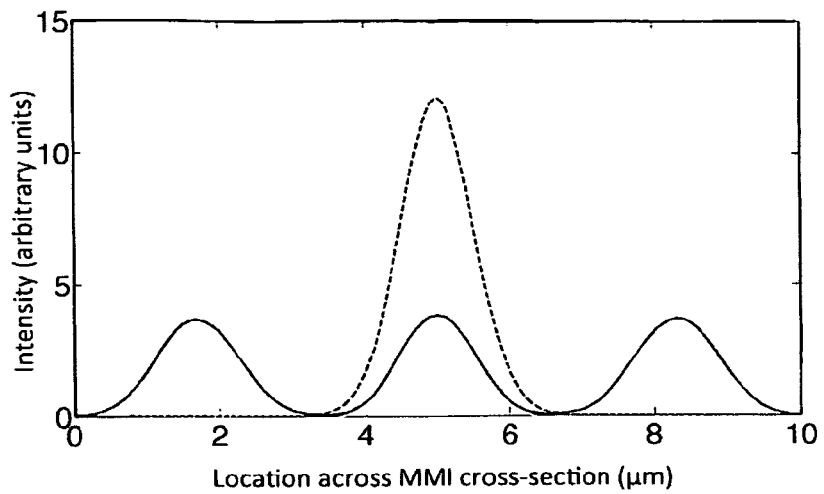
FIG. 16 shows a graphical numerical example of the intensity distribution profile of a multi-mode interferometer assuming a slab effective index of 2, a MMI width of 10 µm, a MMI length of 85 µm and a Gaussian input beam with a FWHM of 1.2 µm The dashed line shows the Gaussian input beam intensity profile centered on the center axis of the MMI.

FIG. 15: Numerical example for an MMI assuming a slab effective index of 2, an MMI width of 10 µm, an MMI length of 85 µm and a Gaussian input beam with a FWHM of 1.2 µm. The ratio of FWHM to MMI width is too small to achieve the desired functionality. The dashed line shows the Gaussian input beam intensity profile (along the horizontal or x-direction across the MMI cross-section) for a displacement of −W/6, where W is the MMI width. It can be seen that two distinct images are created, each with the same FWHM than the input beam. Two images are expected in this case of thin input beams, since the length of the MMI is substantially $L_\pi/2$. The beam is not recentered, it is not flattened and its position is not stabilized (since the output beams move with the position of the input beam, as is seen in FIG. 16). This corresponds to the MMI known to one skilled in the art that is utilized to create multiple images in order to create a 1 to N waveguide splitter when the position of the input beam is well known, typically due to the fact that it is routed to the MMI with a single mode waveguide with a fixed position. The MMI known to one skilled in the art is also used with an input beam whose position is known and fixed, typically a waveguide lithographically defined at the same time than the MMI and not a beam provided by a second optical element aligned with coarse accuracy relative to the width of the input beam, such as pick and place of the second optical element and hybrid assembly with epoxy, bump bonds, thermo-compressive bonding, anodic bonding, eutectic bonding, covalent bonding or other hybrid bonding methods known to one skilled in the art. In the example shown in FIG. 13 the input beam moves by more than 1.4 times its FWHM without adverse consequences. Hybrid assembly is here taken to mean the assembly of two mechanically distinct objects with an attachment process, as opposed for example to the lithographic definition of an MMI and a second optical element coupled to the input of the MMI on a single mechanical substrate.

FIG. 16: Numerical example for an MMI assuming a slab effective index of 2, an MMI width of 10 µm, an MMI length of 85 µm and a Gaussian input beam with a FWHM of 1.2 µm. The ratio of FWHM to MMI width is too small to achieve the desired functionality. The dashed line shows the Gaussian input beam intensity profile centered on the center axis of the MMI. It can be seen that three distinct images are created, each with the same FWHM than the input beam. The beam is not recentered, it is not flattened and its position is not stabilized.

Figure 17:
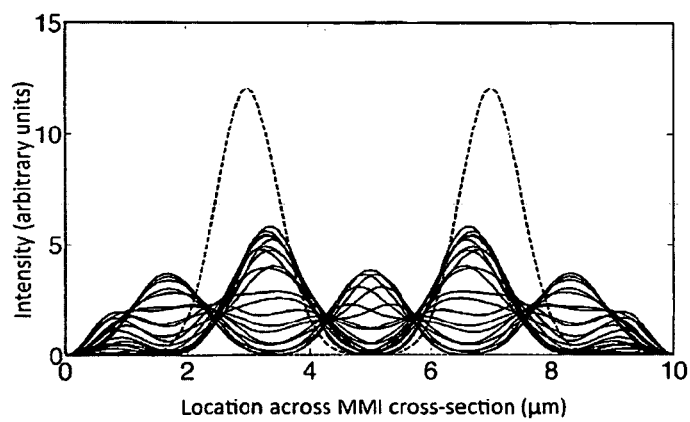
FIG. 17 shows a graphical numerical example of the intensity distribution profile of a multi-mode interferometer assuming a slab effective index of 2, a MMI width of 10 µm, a MMI length of 85 µm and a Gaussian input beam with a FWHM of 1.2 µm. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments.

FIG. 17: Numerical example for an MMI assuming a slab effective index of 2, an MMI width of 10 µm, an MMI length of 85 µm and a Gaussian input beam with a FWHM of 1.2 µm. The ratio of FWHM to MMI width is too small to achieve the desired functionality. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments. It can be seen that the minimum intensity at the output of the MMI taken over all misalignments reaches very low values in most places, and the integral of the minimum over all curves is only a small fraction of the total power of the Gaussian input beams (below 20%). Thus, there is no guaranty that any given waveguide at the output of the MMI will pick up a substantial portion of the optical power and the coupling stabilization scheme does not work.

Figure 18:
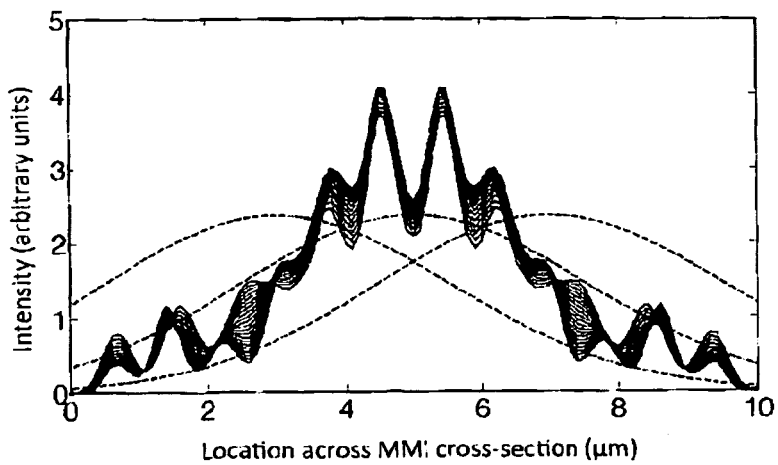
FIG. 18 shows a graphical numerical example of an intensity distribution profile of a multi-mode interferometer assuming a slab effective index of 2, an MMI width of 10 µm, an MMI length of 85 µm and a Gaussian input beam with a FWHM of 6 µm.

FIG. 18: Numerical example for an MMI assuming a slab effective index of 2, an MMI width of 10 µm, an MMI length of 85 µm and a Gaussian input beam with a FWHM of 6 µm. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments. The ratio of FWHM to MMI width is too large for the desired functionality to work well with an MMI sized with a length of $L_\pi/2$ (it would work better for an MMI with a length of substantially $3L_\pi/2$). It can be seen that the power distribution is known a-priori at the output of the MMI irrespectively of the misalignment of the input beam. However, there are strong ripples in the intensity distribution, so that adjacent waveguides would pick up highly different power levels. The spatial phase front distortion is also worsened in this case so that the resulting excess insertion losses would also be more severe.

Figure 19:
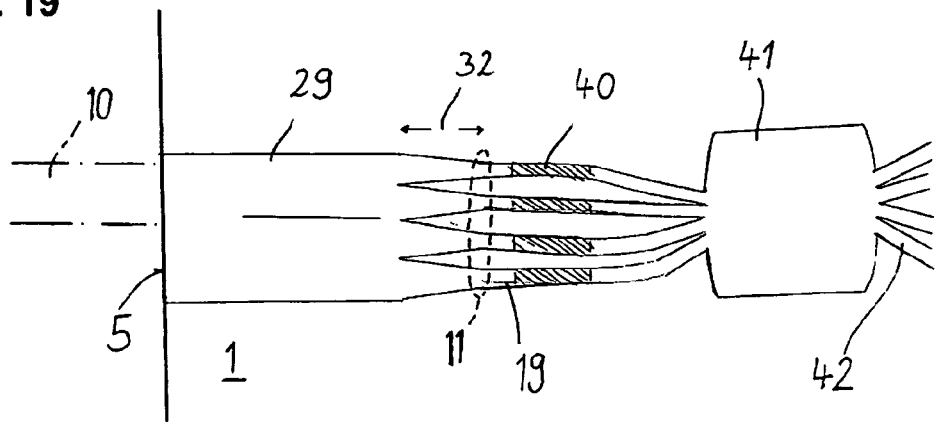
FIG. 19 shows a schematic plan view of an input beam coupled to a multi-mode interferometer located on a primary photonic chip and coupled to a waveguide array via a waveguide array transition. The waveguides are further connected to a star coupler.

FIG. 19: An input beam 10 is coupled to a MMI 29 located on the primary photonic chip 1 and coupled to a waveguide array 11 via a waveguide array transition 32. Each or a subset of the waveguides 19 constituting the waveguide array 11 are provided with a phase modulator 40 to compensate for the phase front distortion at the output of the MMI 29 caused by misalignments of the input beam 10. The waveguides 19 are then further connected to a star coupler 41. If the optical path lengths of the waveguides 19 are properly chosen, for example the optical path length of adjacent waveguides in the waveguide array 11 can increase by a constant increment as is the case in a classic arrayed waveguide grating, different wavelengths can be individually steered to separate output waveguides 42 of the star coupler 41.

Figure 20:
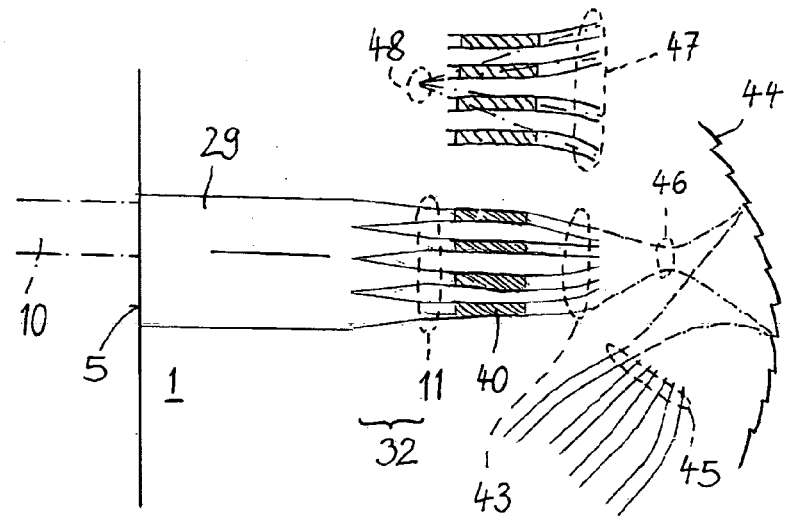
FIG. 20 shows a schematic plan view of an input beam coupled to a multi-mode interferometer located on a primary photonic chip and coupled to a waveguide array via a waveguide array transition. The light is then focused on a (real) focal point and subsequently projected onto an Echelle grating.

FIG. 20: An input beam 10 is coupled to a MMI 29 located on the primary photonic chip 1 and coupled to a waveguide array 11 via a waveguide array transition 32. Each or a subset of the waveguides 19 constituting the waveguide array 11 are provided with a phase modulator 40 to compensate for the phase front distortion at the output of the MMI 29 cause by misalignments of the input beam 10. The light is then focused on a (real) focal point 46 as shown in FIG. 20 and subsequently projected onto an Echelle grating 44. Alternatively the light can be projected onto an Echelle grating 44 as if from a virtual focus 48. In this case the waveguides in region 43 would not be bent inwards towards each other, but outwards from each other as shown in the inset, region 47. The light is further focused from the Echelle grating 44 onto one of the output waveguides 45 of the Echelle grating depending on the wavelength.

Figure 21:
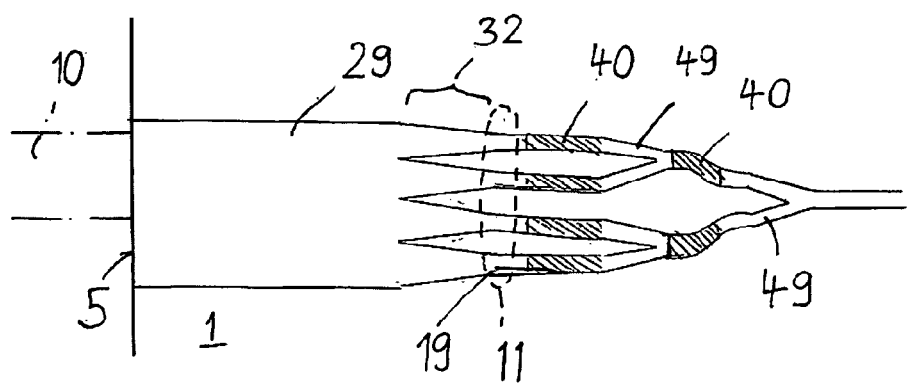
FIG. 21 shows a schematic plan view of an input beam coupled to a multi-mode interferometer located on a primary photonic chip and coupled to a waveguide array via a waveguide array transition. The waveguides are then combined in pairs to form Mach-Zehnder interferometers.

FIG. 21: An input beam 10 is coupled to a MMI 29 located on the primary photonic chip 1 and coupled to a waveguide array 11 via a waveguide array transition 32. Each or a subset of the waveguides 19 constituting the waveguide array 11 are provided with a phase modulator 40 to compensate for the phase front distortion at the output of the MMI 29 caused by misalignments of the input beam 10. The waveguides 19 are then combined in pairs such as with a waveguide combiner 49 shown as a Y-junction in this figure in order to form Mach-Zehnder interferometers. In addition to compensating for phase front distortion due to the lateral displacement of the input beam 10, the phase modulators 40 can also be used to control the functionality of the Mach-Zehnder interferometers, such as switching (if the waveguide combiner is a 2 by 2 port device such as a directional coupler or a 2 by 2 MMI) or modulating if the signals are first combined in the electrical domain. Alternatively, a separate phase modulator can be used for this additional function. It is also sufficient to place phase modulators in only one branch of the two branches of the Mach-Zehnder interferometers to achieve these functionalities, even though it is often beneficial to use a phase modulator in each arm (for example to reduce required voltage levels and power consumption or to reduce modulation chirp in a push-pull configuration). In FIG. 21, a second interferometer stage is added to the outputs of the first stage of Mach-Zehnder interferometers. This can be required for example to implement a 4 by 1 interleaver that allows recombining the light from all four waveguides or for example to implement a QPSK modulator.

Figure 22:
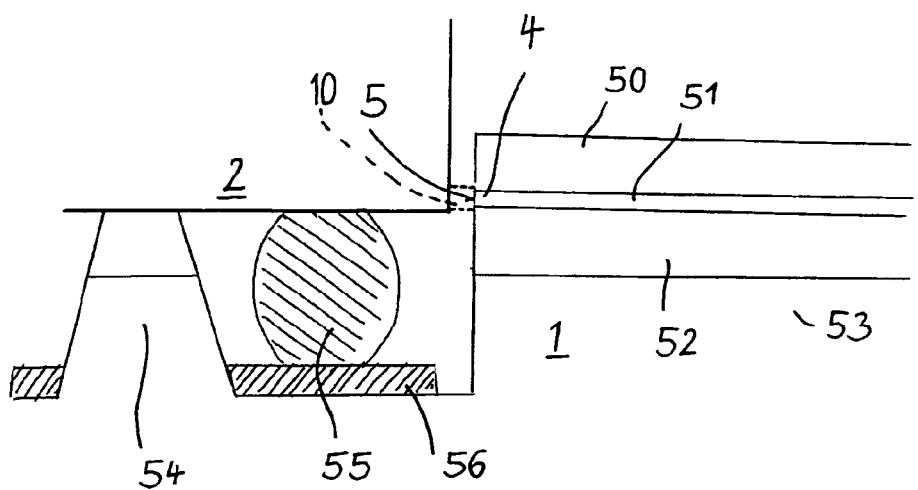
FIG. 22 shows a schematic plan view of a second optical element attached to a primary photonic chip such that an optical input beam provided by the second optical element 2 vertically aligned with a coupling apparatus.

FIG. 22: A second optical element 2 is attached to a primary photonic chip 1 such that an optical input beam 10 provided by the second optical element 2 is vertically aligned with a coupling apparatus 4 that can be one of the apparatus described by the first and second aspects of the invention as well as a butt-coupled waveguide. The coupling apparatus 4 couples light into waveguides defined in the top silicon layer 51 of the primary photonic chip 1. The top silicon layer 51 can be covered by a stack of back-end layers 50 including dielectrics such as silicon dioxide, silicon nitride and silicon oxinitrides, metals and organic layers such as SU8. The top silicon layer 51 is located on top of the buried oxide layer 52 of the SOI material that is located on top of the silicon handle (or bulk silicon) 53. The primary photonic chip is etched to form the interface of primary photonic chip 5. This etch, or another etch, also reaches down to the silicon handle 53. The second optical element is a least partially overlapping with the region of the primary photonic chip etched down to the silicon handle. Some portions of the primary photonic chip below the second optical element are not etched down to the silicon handle and form the spacers 54. The bottom of the region of the primary photonic chip etched down to the silicon handle is at least partially covered with a conductive layer 56 in FIG. 22 and the second optical element is attached to the primary photonic chip with bump bonds 55 that also provide electrical connectivity between the second optical element and the conductive layer 56. In an embodiment the silicon handle is highly doped and regions 56 and 53 are the same so that the current supplying the second optical element at least partially flows through the silicon handle.

Figure 23:
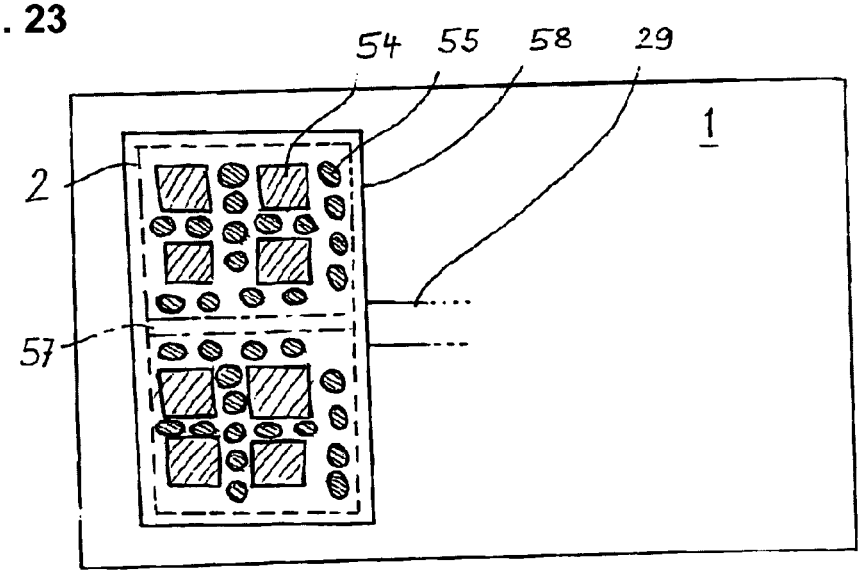
FIG. 23 shows a second optical element attached to a primary photonic chip made out of SOI material.

FIG. 23: A second optical element 2 is attached to a primary photonic chip 1 made out of SOI material. The region 58 is etched down to the silicon handle with the exception of the spacers 54 that are at least partially excluded from said etch so that they are not etched, or etched without being etched down all the way to the silicon handle. The second optical element is a laser chip with a laser strip 57 coarsely aligned with an MMI 29 in the horizontal direction, for example with passive pick and place assembly guided by machine vision but without active optical alignment requiring the laser diode to be operational. Permanent attachment, electrical connectivity and at least partial heat-sinking can be obtained via bump bonds 55.

Figure 24:
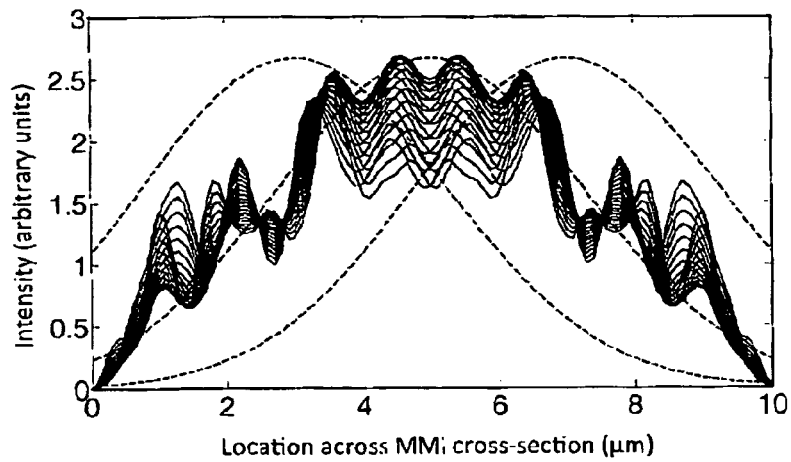
FIG. 24 shows a graphical numerical example of the intensity distribution profile of a multi-mode interferometer assuming a slab effective index of 2, an MMI width of 10 µm, an MMI length of 252 µm and a Gaussian input beam with a FWHM of 5.3 µm.

FIG. 24: Numerical example for an MMI assuming a slab effective index of 2, an MMI width of 10 µm, an MMI length of 252 µm and a Gaussian input beam with a FWHM of 5.3 µm. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments. It can be seen that the intensity profile at the output of the MMI has substantially the same shape in all cases, is substantially flattop compared to the input Gaussian profile, and is recentered on the center axis of the MMI. It can also be seen, by comparison to FIG. 18, that MMIs with a length of substantially $3L_\pi/2$ work better for large beams relative to the MMI width than MMIs with a length of substantially $L_\pi/2$.

Figure 25:
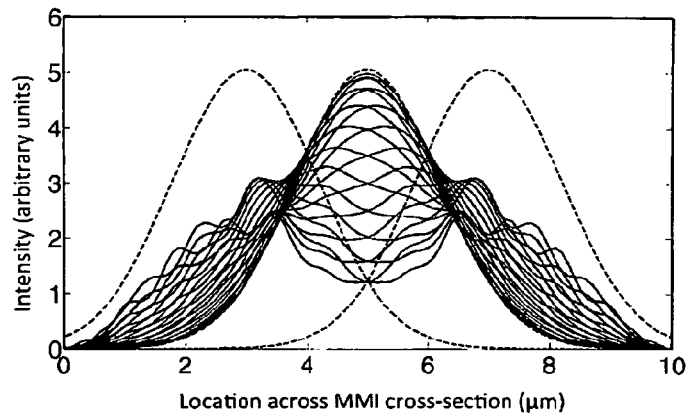
FIG. 25 shows a graphical numerical example of the intensity distribution profile of a multi-mode interferometer assuming a slab effective index of 2, an MMI width of 10 µm, an MMI length of 252 µm and a Gaussian input beam with a FWHM of 2.8 µm.

FIG. 25: Numerical example for an MMI assuming a slab effective index of 2, an MMI width of 10 µm, an MMI length of 252 µm and a Gaussian input beam with a FWHM of 2.8 µm. The dashed curve shows the intensity distribution at the input of the MMI for two extreme misalignments of ±2 µm. The continuous curves show the intensity distribution at the output of the MMI for all intermediate cases of misalignments between ±2 µm, in 200 nm increments. It can be seen that the intensity profile at the output of the MMI has substantial variations and the desired functionality of the MMI works poorly. By comparison to FIG. 13 it can be seen that MMIs with a length of substantially $L_\pi/2$ work better for thin beams relative to the MMI width than MMIs with a length of substantially $3L_\pi/2$.

Figure 26:
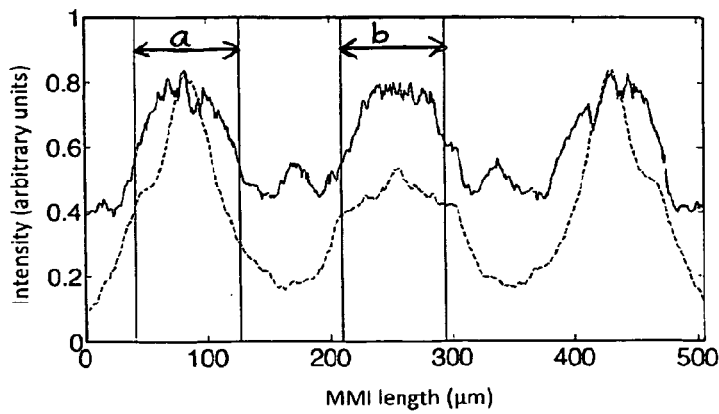
FIG. 26 shows a graphical numerical example of the intensity distribution profile of a multi-mode interferometer assuming a slab effective index of 2 and an MMI width of 10 µm, plotted as a function of the MMI length for an input Gaussian beam with a FWHM of 2.8 µm (dashed line) and for an input FWHM of 5.3 µm (continuous line).

FIG. 26: Numerical example for an MMI assuming a slab effective index of 2 and an MMI width of 10 µm. The minimum intensity at the output of the MMI over all Gaussian input beam displacements between ±2 µm, in 200 nm increments is integrated over the MMI cross-section and divided by the power of the input beam, so that 1 means ideal robustness to input beam misalignment. It is plotted as a function of the MMI length for an input Gaussian beam with a FWHM of 2.8 µm (dashed line) and for an input FWHM of 5.3 µm (continuous line]. The data is plotted for lengths between 0 and 505 µm, the latter corresponding substantially to $3L_\pi$. As expected, it can be seen that results are identical for lengths of L and lengths of $3L_\pi$-L. Vertical lines also indicate the range $L_\pi/4$ to $3L_\pi/4$ (range a) and the range $3L_\pi/2-L_\pi/4$ to $3L_\pi/2+L_\pi/4$ (range b). It can be seen that the scheme works particularly well in ranges a and b. While the performance decrease for small beams in region b is visible (due to the fact that the two images in the image plane $3L_\pi/2$ stop to overlap the minimum output power over input beam misalignments drops), the increase in ripples for large beams in range a is not visible in this curve but is captured by the other plots.

What is claimed is:

1. A method comprising the steps of:
    coupling to a primary photonic chip defining a first optical element an input beam incoming from a photonic device of a second optical element at an input interface of the primary photonic chip, wherein
    the photonic device is adapted to emit the input beam;
    the primary photonic chip comprises a coupling apparatus configured to receive the input beam, having a plurality of single mode optical paths,
    the single mode optical paths are strongly coupled to each other at the input interface of the primary photonic chip, such that regions of said strongly coupled single mode optical paths correspond to one of (i) distinct but highly coupled waveguides forming a multi-mode section and (ii) waveguides fully merged into a multi-mode section;
    wherein the primary photonic chip further comprises a section beyond the input interface in which the plurality of single mode optical paths is singulated into independent single mode optical paths, and
    the coupling step comprises coupling light from the input beam to the coupling apparatus; wherein the power coupled to each of the independent single mode optical paths is substantially equal.

2. The method of claim 1, further comprising positioning a third optical element according to the amount of light coupled to each of the single mode optical paths from the input beam so as to directly or indirectly couple a subset of, but not all of, the single mode optical paths to the third optical element, wherein the subset varies depending on the amount of light coupled to each of the single mode optical paths from the input beam when the second optical element and primary photonic chip are coupled.

3. The method of claim 2, wherein the primary photonic chip includes output ports thereon corresponding to the subset of single mode optical paths coupled to the third optical element that are adjacent to each other, and further comprising the step of selecting the subset to include a fixed number of single mode optical paths such that (i) a minimum power transmitted from any of the corresponding output ports is either maximized or larger than a minimum power required for the single mode optical paths to be functional.

4. The method of claim 1, further comprising connecting a subset of the single mode optical paths to an adaptive waveguide combiner comprising at least one phase shifting element whose settings are either dynamically or statically determined according to power and phase of the light transported by the subset of single mode optical paths.

5. The method of claim 1, wherein a subset of the single mode optical paths are part of independent parallel data lines and further comprising the step of one of (i) powering up or (ii) at least partially powering down receiver subsystems coupled to said data lines via corresponding output ports of the primary photonic chip according to (i) the amount of light arriving at the receiver subsystems or (ii) the amount of light coupled out of the corresponding output ports.

6. The method of claim 1, wherein the coupling apparatus is configured to butt-couple with the input beam, and the coupling step comprises butt-coupling light from the input beam to the coupling apparatus.

7. A photonic apparatus comprising:
a first optical element defined by a primary photonic chip and a second optical element comprising a photonic device adapted to emit an input beam,
wherein the primary photonic chip comprises a coupling apparatus including an input interface which is configured to receive the input beam, and further including a plurality of single mode optical paths strongly coupled to each other at the input interface of the primary photonic chip, such that regions of said strongly coupled single mode optical paths correspond to either (i) distinct but highly coupled waveguides forming a multi-mode section or (ii) waveguides fully merged into a multi-mode section;
wherein the primary photonic chip further comprises a section beyond the input interface in which the plurality of single mode optical paths is singulated into independent single mode optical paths, and
wherein the power coupled to each of the independent single mode optical paths is substantially equal.

8. The apparatus of claim 7, wherein the input interface of the primary photonic chip is defined by a partial etch of the primary photonic chip.

9. The apparatus of claim 7, wherein the single mode optical paths are coupled to a third optical element via grating couplers.

10. The apparatus of claim 7, wherein:
the primary photonic chip further comprises a multi-mode interferometer having said multi-mode section connected to an array of single mode optical paths at an end of the multi-mode section and to the input interface with an arrangement such that light does not pass through a unique single mode optical path creating a bottleneck between the input interface and the multi-mode section, wherein, as measured starting from the input interface of the primary photonic chip, (i) the effective length of the multi-mode interferometer or (ii) the length of the multi-mode interferometer is longer than $L_\pi/4$.

11. The apparatus of claim 7, further comprising said multi-mode section, wherein:
the input interface of the primary photonic chip is connected to the multi-mode section,
the multi-mode section is singulated into several waveguides at the input interface such that a width of said waveguides is smaller than 70% of a maximum single mode waveguide width at the input interface,
the distance between 50% intensity points of waveguide modes of adjacent waveguides of said several waveguides at the input interface is less than 100% of a smaller full width at half maximum of the waveguide modes of said adjacent waveguides at the input interface, and
the multi-mode section is connected to an array of the single mode optical paths at an end thereof.

12. The apparatus of claim 7, wherein light intensity at an end of the multi-mode section is larger than 35% of the maximum of an intensity distribution at the end of the multi-mode section over a topologically connected portion of the multi-mode section that is wider than 35% of the multi-mode section and centered on a center axis of the multi-mode section, and wherein a full width at half maximum of the input beam in a horizontal direction along the input interface is at least 1.5/10 of a width of the multi-mode section.

13. The apparatus of claim 12, wherein the light intensity at the end of the multi-mode section is larger than 50% of the maximum of the intensity distribution at the end of the multi-mode section over a topologically connected portion of the multi-mode section that is wider than 50% of the multi-mode section and centered on the center axis of the multi-mode section.

14. The apparatus of claim 7, wherein at least one of the single mode optical paths is coupled to an end of the multi-mode section and carries light such that at least 20% of said light corresponds to one image created by the multi-mode section and at least 20% of said light corresponds to another image created by the multi-mode section, and configured such that images can be distinguished from each other in that said images would be spatially separated from each other when the input optical beam defined a thinner width but the same optical axis.

15. The apparatus of claim 7, wherein light intensity at an end of the multi-mode section is larger than 35% of the maximum of an intensity distribution at the end of the multi-mode section over a topologically connected portion of the multi-mode section that is wider than 35% of the multi-mode section and centered on a center axis of the multi-mode section for any input optical beam lateral displacement within 2/10 of a width of the multi-mode section relative to a nominal position of the input beam.

16. The apparatus of claim 7, wherein the single mode optical paths are at least partially connected to one of an output stage of an arrayed waveguide grating, an Echelle grating, or an output waveguide coupler of a Mach-Zehnder interferometer.

17. The apparatus of claim 7, wherein:
the primary photonic chip at least partially comprises silicon-on-insulator material,
the single mode optical paths are at least partially comprised of said one or both of (i) distinct but highly coupled waveguides or and (ii) waveguides fully merged into a multi-mode section having a waveguide core made out of a top silicon layer of the silicon-on-insulator material, the second optical element is a laser chip that is attached face down onto the primary photonic chip such that the primary photonic chip is at least partially etched down to a silicon handle of the silicon-on-insulator material in an area over which the laser chip is located, and vertical alignment between the second optical element and the primary photonic chip is determined by spacers corresponding to areas of the primary photonic chip not etched down to the silicon handle.

18. The apparatus of claim 7, wherein the coupling apparatus comprises one entrance area and a plurality of exit areas, the entrance area being in optical communication with the exit areas, wherein the entrance area is an input port of the primary photonic chip and the exit areas are output ports of the primary photonic chip.

19. The apparatus of claim 7, wherein the primary photonic chip is configured to butt-couple with the input beam.

20. The apparatus of claim 7, wherein the plurality of single mode optical paths strongly coupled to each other at the input interface of the primary photonic chip comprise a plurality of adjacent waveguides having waveguide cores and waveguide modes defining a field intensity, wherein, for each pair of adjacent waveguides having a first waveguide and a second waveguide, with at least one of (i) the core of the second waveguide being at most as large as the core of the first waveguide and (ii) the intensity distribution of the second waveguide being at most as large as the intensity distribution of the first waveguide, the spacing between the first waveguide and the second waveguide, said spacing defined as a distance between points where the field intensity of the waveguide modes has decayed below 50% of the maximum field intensity of the waveguide mode, is less than 100% of the width of the core of the second waveguide or smaller than 100% of the full width at half maximum of the intensity distribution of the waveguide mode of the second waveguide.

21. The apparatus of claim 7, wherein the plurality of single mode optical paths correspond to a plurality of individually defined waveguides, wherein either (i) the plurality of individually defined waveguides have identical cross sections, and the coupling length required to couple light from one waveguide to another is less than 200 µm, or (ii) the plurality of individually defined waveguides are asymmetric, and the coupling coefficient between the waveguides is more than 0.0078 µm$^{-1}$.

22. The apparatus of claim 7, wherein the plurality of single mode optical paths correspond to a plurality of individually defined waveguides, wherein either (i) the plurality of individually defined waveguides have identical cross sections, and the coupling length required to couple light from one waveguide to another is less than 100 µm, or (ii) the plurality of individually defined waveguides are asymmetric, and the coupling coefficient between the waveguides is more than 0.0157 µm$^{-1}$.

23. The apparatus of claim 7, wherein the plurality of single mode optical paths correspond to a plurality of individually defined waveguides, wherein either (i) the plurality of individually defined waveguides have identical cross sections, and the coupling length required to couple light from one waveguide to another is less than 50 µm, or (ii) the plurality of individually defined waveguides are asymmetric, and the coupling coefficient between the waveguides is more than 0.03 µm$^{-1}$.

24. The apparatus of claim 7, wherein the primary photonic chip further comprises a multi-mode interferometer having said multi-mode section connected to an array of single mode optical paths at an end of the multi-mode section and to the input interface with an arrangement such that light does not pass through a unique single mode optical path creating a bottleneck between the input interface and the multi-mode section, and wherein the multi-mode section of the multi-mode interferometer reaches all the way to the input interface of the primary photonic chip.

25. The apparatus of claim 7, wherein the primary photonic chip further comprises a multi-mode interferometer having said multi-mode section connected to an array of single mode optical paths at an end of the multi-mode section and to the input interface with an arrangement such that light does not pass through a unique single mode optical path creating a bottleneck between the input interface and the multi-mode section, and wherein the multi-mode interferometer is configured as to create multiple overlapping images at its output.

26. The apparatus of claim 7, wherein a subset of the single mode optical paths is routed off the primary photonic chip to a plurality of optical fibers.

27. The apparatus of claim 7, wherein the power provided along each of the independent single mode optical paths is sufficiently high to render the optical path functional for delivery of power to a device coupled to one of the independent single mode optical paths.

28. The apparatus of claim 7, wherein the primary photonic chip further comprises a multi-mode interferometer having said multi-mode section connected to an array of single mode optical paths at an end of the multi-mode section and to the input interface with an arrangement such that light does not pass through a unique single mode optical path creating a bottleneck between the input interface and the multi-mode section, and wherein the multi-mode interferometer converts a misalignment of the input beam into a slowly varying phase front distortion that does not substantially impact the amount of light coupled into the independent single mode optical paths.

29. The apparatus of claim 28, wherein the phase front distortion remains below 1 radian per micron over at least 80% of the width of the multi-mode interferometer.

* * * * *